(12) United States Patent
Liu et al.

(10) Patent No.: US 12,273,193 B2
(45) Date of Patent: Apr. 8, 2025

(54) RAPTOR CODE FEEDBACK

(71) Applicant: QUALCOMM Incorporated, San Diego, CA (US)

(72) Inventors: Kangqi Liu, Beijing (CN); Changlong Xu, Beijing (CN); Jian Li, Beijing (CN); Liangming Wu, Beijing (CN); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 193 days.

(21) Appl. No.: 17/759,620

(22) PCT Filed: Mar. 13, 2020

(86) PCT No.: PCT/CN2020/079207
§ 371 (c)(1),
(2) Date: Jul. 28, 2022

(87) PCT Pub. No.: WO2021/179287
PCT Pub. Date: Sep. 16, 2021

(65) Prior Publication Data
US 2023/0072054 A1     Mar. 9, 2023

(51) Int. Cl.
*H04L 1/00*      (2006.01)
*H03M 13/37*  (2006.01)

(52) U.S. Cl.
CPC ...... *H04L 1/0043* (2013.01); *H03M 13/3761* (2013.01); *H04L 1/0052* (2013.01); *H04L 1/0064* (2013.01)

(58) Field of Classification Search
CPC .......... H03M 13/3761; H03M 13/6306; H04L 1/004; H04L 1/0041; H04L 1/0043;
(Continued)

(56) References Cited

U.S. PATENT DOCUMENTS 9,215,457 B2 * 12/2015 Koike-Akino .... H03M 13/3761
9,270,299 B2    2/2016 Luby et al.
(Continued)

FOREIGN PATENT DOCUMENTS

CN     103444087 A    12/2013
CN     110138451 A    8/2019
(Continued)

OTHER PUBLICATIONS

Hagedorn A., et al., "Rateless with Coding Feedback", IEEE, Infocom, The 28th Conference on Computer Communications, Piscataway, NJ, USA, XP031468938, ISBN: 978-1-4244-3512- 8, Abstract, Apr. 19, 2009, pp. 1791-1799.
(Continued)

*Primary Examiner* — Betsy Deppe
(74) *Attorney, Agent, or Firm* — Holland & Hart LLP

(57) ABSTRACT

Methods, systems, and devices for wireless communications are described. An encoding device may encode a set of source symbols using one or more raptor codes to generate a first set of encoded symbols and may transmit the first set of encoded symbols to a decoding device. The decoding device may successfully recover a source symbol of the set of source symbols from the first set of encoded symbols and may transmit an indication of the source symbol to the encoding device. The encoding device may encode one or more source symbols of the set of source symbols using the one or more raptor codes to generate a second set of encoded symbols based on receiving the indication of the source symbol and may transmit the second set of encoded symbols to the decoding device.

30 Claims, 15 Drawing Sheets

(58) Field of Classification Search
CPC ... H04L 1/0045; H04L 1/0052; H04L 1/0056; H04L 1/0064; H04L 1/12; H04L 1/16; H04L 1/18; H04L 1/1812; H04L 1/1819
See application file for complete search history.

(56) References Cited

U.S. PATENT DOCUMENTS 10,504,542 B2 * 12/2019 Li .......................... G11B 5/09
2013/0308700 A1 11/2013 Koike-Akino et al.

FOREIGN PATENT DOCUMENTS

| EP | 2846469 A1 | 3/2015 |
| KR | 20080099243 A | 11/2008 |
| KR | 20130040087 A | 4/2013 |
| WO | WO-2012109614 | 8/2012 |

OTHER PUBLICATIONS

Supplementary European Search Report—EP20924918—Search Authority—Munich—Nov. 2, 2023.
International Search Report and Written Opinion—PCT/CN2020/079207—ISA/EPO—Dec. 10, 2020.
Nokia: "Splitting Annex-B to Separate Normative FEC Encoder and Informative FEC Decoder", 3GPP TSG-SA4#36 Meeting, S4-050546, Paris, France, Sep. 5, 2005 (Sep. 5, 2005), pp. 1-13.

* cited by examiner

RAPTOR CODE FEEDBACK

CROSS REFERENCE

The present Application is a 371 national stage filing of International PCT Application No. PCT/CN2020/079207 by Liu et al. entitled "RAPTOR CODE FEEDBACK," filed Mar. 13, 2020, which is assigned to the assignee hereof, and which is expressly incorporated by reference in its entirety herein.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE). The communication devices may be configured to perform one or more operations related to raptor coding.

SUMMARY

The described techniques relate to improved methods, systems, devices, and apparatuses that support raptor code feedback. Generally, the described techniques provide for an encoding device to perform encoding for a retransmission in a manner that reduces computational complexity associated with encoding or decoding the retransmission. For instance, an encoding device may encode a set of source symbols using one or more raptor codes to generate a first set of encoded symbols and may transmit the first set of encoded symbols to a decoding device. The decoding device may successfully recover a source symbol of the set of source symbols from the first set of encoded symbols and may transmit an indication of the source symbol to the encoding device. The encoding device may encode one or more source symbols of the set of source symbols using the one or more raptor codes to generate a second set of encoded symbols based on receiving the indication of the source symbol and may transmit the second set of encoded symbols to the decoding device. The one or more source symbols may be symbols of the set of source symbols distinct from the symbol indicated by the decoding device.

A method for wireless communication is described. The method may include encoding a set of source symbols using one or more raptor codes to generate a first set of encoded symbols, transmitting the first set of encoded symbols, receiving an indication of a source symbol of the set of source symbols successfully recovered from the first set of encoded symbols, encoding one or more source symbols of the set of source symbols using the one or more raptor codes to generate a second set of encoded symbols based on receiving the indication of the source symbol, and transmitting the second set of encoded symbols.

An apparatus for wireless communication is described. The apparatus may include a processor, memory in electronic communication with the processor, and instructions stored in the memory. The instructions may be executable by the processor to cause the apparatus to encode a set of source symbols using one or more raptor codes to generate a first set of encoded symbols, transmit the first set of encoded symbols, receive an indication of a source symbol of the set of source symbols successfully recovered from the first set of encoded symbols, encode one or more source symbols of the set of source symbols using the one or more raptor codes to generate a second set of encoded symbols based on receiving the indication of the source symbol, and transmit the second set of encoded symbols.

Another apparatus for wireless communication is described. The apparatus may include means for encoding a set of source symbols using one or more raptor codes to generate a first set of encoded symbols, means for transmitting the first set of encoded symbols, means for receiving an indication of a source symbol of the set of source symbols successfully recovered from the first set of encoded symbols, means for encoding one or more source symbols of the set of source symbols using the one or more raptor codes to generate a second set of encoded symbols based on receiving the indication of the source symbol, and means for transmitting the second set of encoded symbols.

A non-transitory computer-readable medium storing code for wireless communication is described. The code may include instructions executable by a processor to encode a set of source symbols using one or more raptor codes to generate a first set of encoded symbols, transmit the first set of encoded symbols, receive an indication of a source symbol of the set of source symbols successfully recovered from the first set of encoded symbols, encode one or more source symbols of the set of source symbols using the one or more raptor codes to generate a second set of encoded symbols based on receiving the indication of the source symbol, and transmit the second set of encoded symbols.

In some examples of the method, apparatuses, and non-transitory computer-readable medium described herein, receiving the indication of the source symbol may include operations, features, means, or instructions for receiving an indication of a subset of the set of source symbols that includes the source symbol, each source symbol of the subset successfully recovered from the first set of encoded symbols.

In some examples of the method, apparatuses, and non-transitory computer-readable medium described herein, the one or more source symbols excludes each source symbol of the subset based on receiving the indication of the subset.

In some examples of the method, apparatuses, and non-transitory computer-readable medium described herein, encoding to generate an encoded symbol of the second set of encoded symbols may include operations, features, means, or instructions for identifying a degree from a degree distribution, selecting at least one of the one or more source symbols from the set of source symbols according to the identified degree, and generating the encoded symbol based on the selected at least one of the one or more source symbols.

Some examples of the method, apparatuses, and non-transitory computer-readable medium described herein may further include operations, features, means, or instructions for selecting the successfully recovered source symbol according to the identified degree, and refraining from combining the successfully recovered source symbol with the at least one of the one or more source symbols when generating the encoded symbol and based on receiving the indication of the subset.

Some examples of the method, apparatuses, and non-transitory computer-readable medium described herein may further include operations, features, means, or instructions for receiving an indication of a number of symbols in the first set of encoded symbols that were successfully received, and selecting the successfully recovered source symbol based on the indicated number of symbols.

Some examples of the method, apparatuses, and non-transitory computer-readable medium described herein may further include operations, features, means, or instructions for selecting the successfully recovered source symbol may be based on the indicated number of symbols satisfying a threshold.

Some examples of the method, apparatuses, and non-transitory computer-readable medium described herein may further include operations, features, means, or instructions for selecting the successfully recovered source symbol may be based on a number of symbols in the first set of encoded symbols satisfying a threshold.

Some examples of the method, apparatuses, and non-transitory computer-readable medium described herein may further include operations, features, means, or instructions for encoding the set of source symbols may be based on the degree distribution.

In some examples of the method, apparatuses, and non-transitory computer-readable medium described herein, the selecting may include operations, features, means, or instructions for selecting the at least one of the one or more source symbols from a second subset of the set of source symbols, where each source symbol of the subset may be excluded from the second subset, and refraining from combining the successfully recovered source symbol with the at least one of the one or more source symbols when generating the encoded symbol and based on selecting from the second subset.

Some examples of the method, apparatuses, and non-transitory computer-readable medium described herein may further include operations, features, means, or instructions for receiving an indication of a number of symbols in the first set of encoded symbols that were successfully received, and selecting the at least one of the one or more source symbols from the second subset based on the indicated number of symbols.

Some examples of the method, apparatuses, and non-transitory computer-readable medium described herein may further include operations, features, means, or instructions for selecting the at least one of the one or more source symbols from the second subset may be based on the indicated number of symbols satisfying a threshold.

Some examples of the method, apparatuses, and non-transitory computer-readable medium described herein may further include operations, features, means, or instructions for selecting the at least one of the one or more source symbols from the second subset may be based on a number of symbols in the first set of encoded symbols satisfying a threshold.

In some examples of the method, apparatuses, and non-transitory computer-readable medium described herein, the degree distribution used when encoding the one or more source symbols may be distinct from a second degree distribution used when encoding the set of source symbols.

Some examples of the method, apparatuses, and non-transitory computer-readable medium described herein may further include operations, features, means, or instructions for receiving an indication of a second subset of the set of source symbols after transmitting the first set of encoded symbols, where the one or more source symbols excludes each source symbol of the second subset based on receiving the indication of the second subset.

Some examples of the method, apparatuses, and non-transitory computer-readable medium described herein may further include operations, features, means, or instructions for determining a feedback period, where receiving the indication of the source symbol may be based on the determined feedback period.

Some examples of the method, apparatuses, and non-transitory computer-readable medium described herein may further include operations, features, means, or instructions for determining the feedback period may be based on a number of symbols in the first set of encoded symbols.

Some examples of the method, apparatuses, and non-transitory computer-readable medium described herein may further include operations, features, means, or instructions for receiving an indication of a number of symbols in the first set of encoded symbols successfully received, and determining the feedback period based on receiving the indication of the number of symbols.

Some examples of the method, apparatuses, and non-transitory computer-readable medium described herein may further include operations, features, means, or instructions for determining the feedback period may be based on a number of symbols in a third set of encoded symbols, where the third set of encoded symbols was transmitted before transmitting the first set of encoded symbols.

Some examples of the method, apparatuses, and non-transitory computer-readable medium described herein may further include operations, features, means, or instructions for receiving an indication of a number of symbols in a third set of encoded symbols successfully received, where the third set of encoded symbols was transmitted before transmitting the first set of encoded symbols, and where determining the feedback period may be based on receiving the number of symbols.

In some examples of the method, apparatuses, and non-transitory computer-readable medium described herein, the one or more source symbols excludes the source symbol based on receiving the indication of the source symbol.

A method for wireless communication is described. The method may include receiving a first set of encoded symbols that is encoded according to one or more raptor codes, recovering successfully from the first set of encoded symbols a source symbol of a set of source symbols associated with the first set of encoded symbols, transmitting an indication of the source symbol based on recovering the source symbol, and receiving a second set of encoded symbols based on transmitting the indication of the source symbol, the second set of encoded symbols encoded according to the one or more raptor codes and associated with one or more source symbols of the set of source symbols.

An apparatus for wireless communication is described. The apparatus may include a processor, memory in electronic communication with the processor, and instructions stored in the memory. The instructions may be executable by the processor to cause the apparatus to receive a first set of encoded symbols that is encoded according to one or more raptor codes, recover successfully from the first set of encoded symbols a source symbol of a set of source symbols associated with the first set of encoded symbols, transmit an indication of the source symbol based on recovering the source symbol, and receive a second set of encoded symbols based on transmitting the indication of the source symbol, the second set of encoded symbols encoded according to the one or more raptor codes and associated with one or more source symbols of the set of source symbols.

Another apparatus for wireless communication is described. The apparatus may include means for receiving a first set of encoded symbols that is encoded according to one or more raptor codes, means for recovering successfully from the first set of encoded symbols a source symbol of a set of source symbols associated with the first set of encoded symbols, means for transmitting an indication of the source symbol based on recovering the source symbol, and means for receiving a second set of encoded symbols based on transmitting the indication of the source symbol, the second set of encoded symbols encoded according to the one or more raptor codes and associated with one or more source symbols of the set of source symbols.

A non-transitory computer-readable medium storing code for wireless communication is described. The code may include instructions executable by a processor to receive a first set of encoded symbols that is encoded according to one or more raptor codes, recover successfully from the first set of encoded symbols a source symbol of a set of source symbols associated with the first set of encoded symbols, transmit an indication of the source symbol based on recovering the source symbol, and receive a second set of encoded symbols based on transmitting the indication of the source symbol, the second set of encoded symbols encoded according to the one or more raptor codes and associated with one or more source symbols of the set of source symbols.

Some examples of the method, apparatuses, and non-transitory computer-readable medium described herein may further include operations, features, means, or instructions for recovering successfully each source symbol of a subset of the set of source symbols, where transmitting the indication of the source symbol includes transmitting an indication of the subset.

In some examples of the method, apparatuses, and non-transitory computer-readable medium described herein, the one or more source symbols excludes each source symbol of the subset based on transmitting the indication of the subset.

Some examples of the method, apparatuses, and non-transitory computer-readable medium described herein may further include operations, features, means, or instructions for transmitting an indication of a second subset of the set of source symbols after receiving the first set of encoded symbols, where the one or more source symbols excludes each source symbol of the second subset based on transmitting the indication of the second subset.

Some examples of the method, apparatuses, and non-transitory computer-readable medium described herein may further include operations, features, means, or instructions for determining a feedback period, where transmitting the indication of the source symbol may be based on determining the feedback period.

In some examples of the method, apparatuses, and non-transitory computer-readable medium described herein, the feedback period may be based on a number of symbols in the first set of encoded symbols.

In some examples of the method, apparatuses, and non-transitory computer-readable medium described herein, the feedback period may be based on a number of symbols in a third set of encoded symbols, where the third set of encoded symbols was received before receiving the first set of encoded symbols.

Some examples of the method, apparatuses, and non-transitory computer-readable medium described herein may further include operations, features, means, or instructions for transmitting an indication of a number of symbols in the first set of encoded symbols, where a time for transmitting the indication of the symbol may be based on transmitting the indication of the number of symbols.

Some examples of the method, apparatuses, and non-transitory computer-readable medium described herein may further include operations, features, means, or instructions for transmitting an indication of a number of symbols in a third set of encoded symbols, where the third set of encoded symbols was received before the first set of encoded symbols, and where a time for transmitting the indication of the symbol may be based on transmitting the indication of the number of symbols.

In some examples of the method, apparatuses, and non-transitory computer-readable medium described herein, the source symbol may have an associated degree whose value may be one, and transmitting the indication of the source symbol may include operations, features, means, or instructions for transmitting an indication for each source symbol successfully recovered and that may have an associated degree whose value may be one, and refraining from transmitting an indication for each source symbol successfully recovered and that may have an associated degree whose value may be greater than one.

In some examples of the method, apparatuses, and non-transitory computer-readable medium described herein, the one or more source symbols excludes the source symbol based on transmitting the indication of the source symbol.

DETAILED DESCRIPTION

Figure 1:
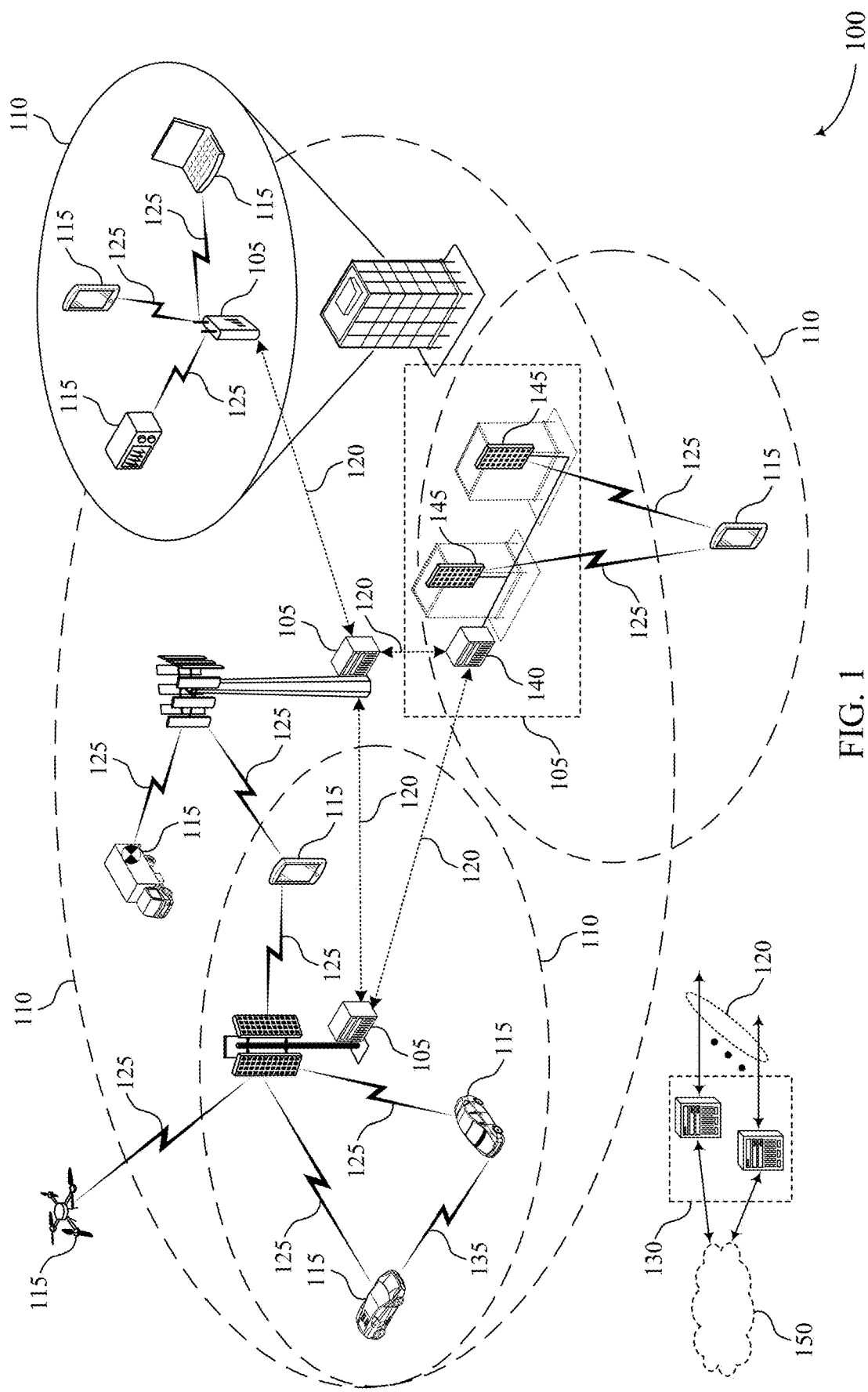
FIG. 1 illustrates an example of a wireless communications system that supports raptor code feedback in accordance with aspects of the present disclosure.

Raptor coding is a type of fountain coding method in which symbols (e.g., data symbols for communication in a message) may be encoded. Raptor coding may involve combining source symbols together (e.g., via exclusive or (XOR) operations) to form encoded symbols. The number of source symbols combined together for a given encoded symbol may be referred to as a degree, where the degree may be chosen from a degree distribution. Each encoded symbol may have a variable degree number based on the distribution. As the degree of an encoded symbol rises, the computational complexity associated with decoding that symbol may increase. As such, in cases where the average degree of a distribution is higher, more time may be spent decoding, which may cause increased latency associated with decoding the encoded symbols.

Decreasing the average degree may involve a decoding device providing feedback to indicate which source symbols have been successfully recovered by the decoding device. For instance, the decoding device may receive a first set of encoded symbols from an encoding device and may recover a source symbol from the first set of encoded symbols. The decoding device may transmit an indication of the recovered source symbol along with other recovered source symbols and may receive, in turn, a second set of encoded symbols. The source symbols that are reported by the decoding device may be said to be in a given set (W). The encoding device may encode the second set of encoded symbols such that the average degree of the second set of encoded symbols is less than the average degree of the first set of encoded symbols.

One method by which the encoding device may decrease the average degree is to use the same degree distribution and to select among any of the original set of source symbols for combination, but without the limitation of combining source symbols only in W. For instance, if the encoding device determines an encoded symbol is to have a degree of 3 and selects one source symbol in W and two source symbols not in W, the encoding device may combine (e.g., XOR) the two source symbols not in W when generating the encoded symbol and may disregard the selected source symbol in W.

Another method by which the encoding device may decrease the average is to use a different degree distribution and to select only among the source symbols not in W. The encoding device, as before, may combine (e.g., XOR) the selected source symbols to generate encoded symbols. Since there may be fewer source symbols not in W as compared to the total number of source symbols, the encoding device may use a degree distribution with a lower average degree.

Aspects of the disclosure are initially described in the context of wireless communications systems. Additional aspects of the disclosure are described in the context of a raptor encoding procedure, encoding schemes, and a process flow. Aspects of the disclosure are further illustrated by and described with reference to apparatus diagrams, system diagrams, and flowcharts that relate to raptor code feedback.

FIG. 1 illustrates an example of a wireless communications system 100 that supports raptor code feedback in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The operators IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

Wireless communications systems are widely deployed to provide various types of communication content such as voice, video, packet data, messaging, broadcast, and so on. These systems may be multiple-access systems capable of supporting communication with multiple users by sharing the available system resources (e.g., time, frequency, and power). A wireless network, for example a wireless local area network (WLAN), such as a Wi-Fi (i.e., Institute of Electrical and Electronics Engineers (IEEE) 802.11) network may include an access point (AP) that may communicate with one or more wireless or mobile devices. The AP may be coupled to a network, such as the Internet, and may enable a mobile device to communicate via the network (or communicate with other devices coupled to the access point). A wireless device may communicate with a network device bi-directionally. For example, in a WLAN, a device may communicate with an associated AP via downlink (e.g., the communication link from the AP to the device) and uplink (e.g., the communication link from the device to the AP). A wireless personal area network (PAN), which may include a Bluetooth connection, may provide for short range wireless connections between two or more paired wireless devices. For example, wireless devices such as cellular phones may utilize wireless PAN communications to exchange information such as audio signals with wireless headsets.

In some cases, an encoding device (e.g., a UE 115 or base station 105) may perform fountain encoding. Fountain codes may be rateless codes whose generator matrix may have unlimited columns. Performing fountain coding may involve the encoding device dividing a radio link control (RLC) service data unit (SDU) into K data blocks $s_1, \ldots, s_K$, where each of the data blocks may contain a same number of bits. The encoding device may then encode the K data blocks into Z packets $p_1, \ldots, p_Z$ using a mother generator matrix. For instance, the encoding device may determine each of the Z packets as $p_z = \Sigma_{k=1}^{K} s_k H_{kz}$, where $H_{kn}$ may represent a value of an entry at a kth row and an zth column of the mother generator matrix H. Each of the Z packets may correspond to a different column of the mother generator matrix.

When a decoding device receives the fountain encoded transmission from the encoding device, the decoding device may receive at least some of the Z packets (e.g., Q, where Q≤Z). Assuming that the number of Q packets successfully received is greater than a threshold amount (e.g., greater than K), the decoding device may construct invertible generator matrix G from the Q packets. For instance, the decoding device may identify a header for a first of the packets and may identify, from the header, a column of the mother generator matrix H. The decoding device may perform this identification and may construct the invertible generator matrix by mapping each of the identified columns of the mother generator matrix H to a column of the invertible generator matrix G.

Once the decoding device generates the invertible generator matrix G, the decoding device may reconstruct the K data blocks based on the invertible generator matrix G. For instance, if each of the K recovered data blocks are denoted by $c_k$, where 0<k≤K, and each of the packets is denoted by $p_q$, where 0<q≤Q, then $c_k$ may be equal to $\Sigma_{q=1}^{Q} p_q G_{qk}^{-1}$, where $G_{qk}^{-1}$ may represent a qth row and a kth column of the inverted generator matrix $G^{-1}$. Generally, the data blocks may be recovered if invertible generator matrix G according to the Q data blocks is invertible or if the rank of invertible generator matrix G is K.

One type of fountain coding is Luby transform (LT) coding. Performing LT encoding may involve randomly choosing a degree $d_i$ from a degree distribution and randomly choosing $d_i$ distinct source symbols, which may be a type of data block, with uniform distribution and combining (e.g., performing one or more XOR operation) them. LT decoding (e.g., belief-propagation (BP) decoding) may involve first finding an encoded symbol $t_1$ connected to one source symbol $s_i$ (e.g., an encoded symbol whose degree is one). Then the decoding device may set $s_i$ to equal $t_j$; may XOR $s_i$ to each encoding symbols connected to $s_i$; and may remove each edge connected to source symbol $s_i$. Such a procedure may continue until $s_i$ is determined for each value of i. If there is no encoding symbol connected to only one source symbol $s_{i_o}$, the decoding process may fail for that $s_{i_o}$ value.

Generally, the techniques described herein may provide for an encoding device (e.g., a UE 115 or base station 105) to perform encoding for a retransmission in a manner that reduces computational complexity associated with encoding or decoding the retransmission. For instance, an encoding device (e.g., a UE 115 or base station 105) may encode a set of source symbols using one or more raptor codes to generate a first set of encoded symbols and may transmit the first set of encoded symbols to a decoding device (e.g., a UE 115 or base station 105). The decoding device may successfully recover a source symbol of the set of source symbols from the first set of encoded symbols and may transmit an indication of the source symbol to the encoding device. The encoding device may encode one or more source symbols of the set of source symbols using the one or more raptor codes to generate a second set of encoded symbols based on receiving the indication of the source symbol and may transmit the second set of encoded symbols to the decoding device.

Figure 2:
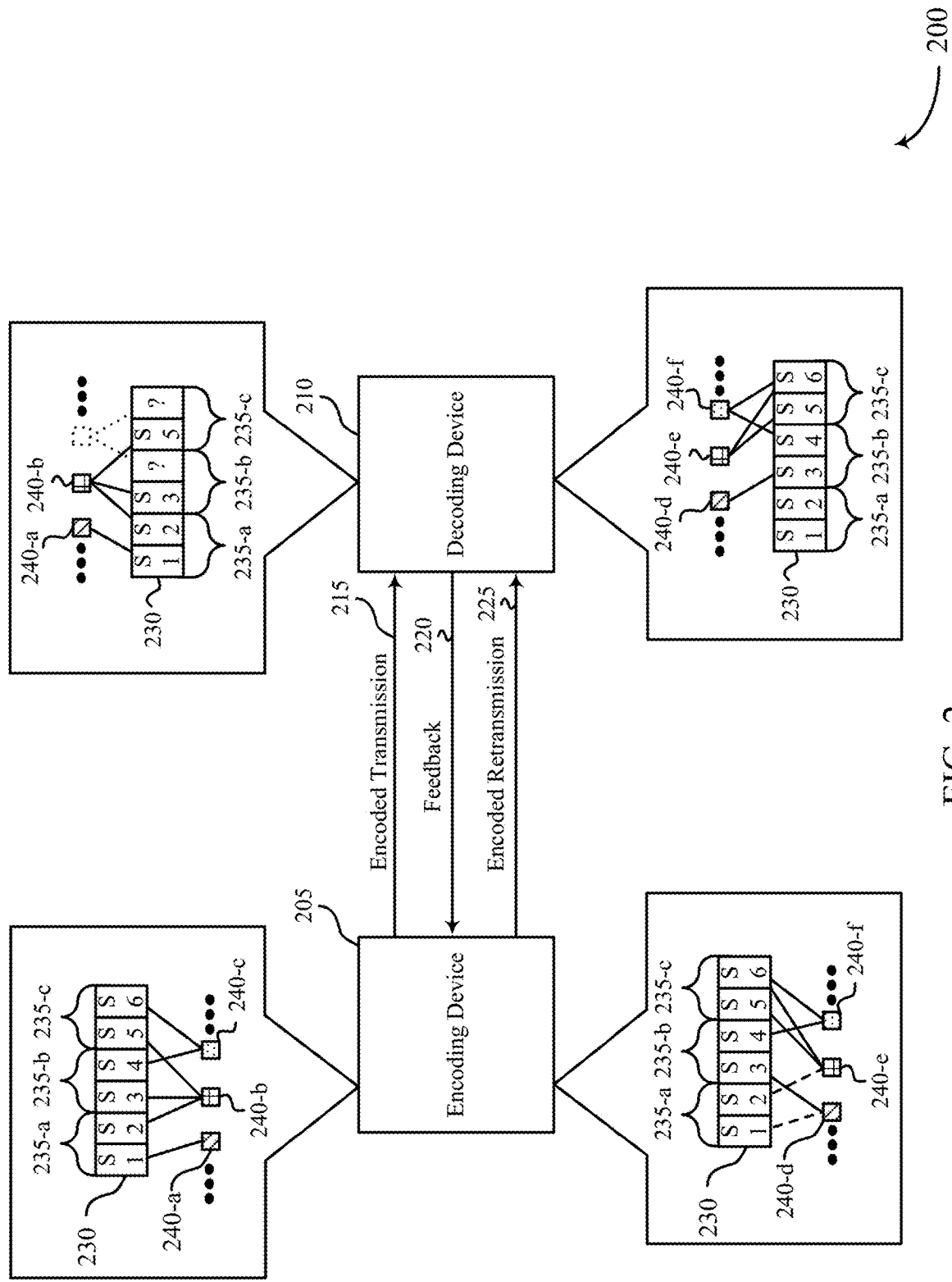
FIG. 2 illustrates an example of a wireless communications system that supports raptor code feedback in accordance with aspects of the present disclosure.

FIG. 2 illustrates an example of a wireless communications system 200 that supports raptor code feedback in accordance with aspects of the present disclosure. In some examples, wireless communications system 200 may implement aspects of wireless communications system 100. For instance, encoding device 205 and decoding device 210 may each be examples of a UE 115 or a base station 105 as described with reference to FIG. 1.

At an initial time, an encoding device 205 may have a set of source symbols 230 to indicate to a decoding device 210. For instance, in the present example, encoding device 205 may have six source symbols 230 (e.g., S1-S6) to indicate to the decoding device 210. The source symbols 230 may be divided into source symbol sets 235, where each source symbol set may be a subset of a total set of source symbols 230. For instance, source symbol set 235-*a* may include S1 and S2; source symbol set 235-*b* may include S3 and S4; and source symbol set 235-*c* may include S5 and S6.

Generally, each data of length n bits may be partitioned into K=n/l input symbols (e.g., source symbols 230) such that each input symbol may contain l bits. The encoding device 205 may use these K symbols to generate encoded symbols 240. In the present example, K may equal 6. Each m consecutive source symbols 230 may form a source symbol set 235, where the total number of source symbol sets 235 X may be equal to K/m. When m=1, each source symbol 230 may be a source symbol set 235 (e.g., there will be K source symbol sets 235). When m=K/2, then there will be two source symbol sets 235. In the present example, m may equal 2 and X may equal 3. As described herein, if decoding device 210 recovers each source symbol 230 of a source symbol set 235 x, then x may be added to an index set W. Given a feedback period, decoding device 210 may report W to the encoding device 205 periodically.

Prior to indicating the source symbols 230, encoding device 205 may convert the source symbols 230 to a first set of encoded symbols 240. To generate each encoded symbol 240, the encoding device 205 may select a degree $d_i$ from a degree distribution; may select at least one of the source symbols 230 according to the identified degree; and may generate the encoded symbol based on the selected at least one of the source symbols 230. For instance, to generate encoded symbol 240-*a*, encoding device 205 may identify a degree of one from a degree distribution and may select one source symbol 230 accordingly (e.g., S1). The selected source symbol 230 may be the encoded symbol 240-*a*. Additionally, to generate encoded symbol 240-*b*, encoding device 205 may identify a degree of three from a degree distribution; may select three source symbols 230 accordingly (e.g., S2, S3, and S5); and may combine the source symbols 230 together (e.g., via an XOR operation) to generate encoded symbol 240-*b*. Additionally, to generate encoded symbol 240-*c*, encoding device 205 may identify a degree of two from a degree distribution; may select two source symbols 230 accordingly (e.g., S4 and S6); and may combine the source symbols 230 together (e.g., via an XOR operation) to generate encoded symbol 240-*c*. Encoding device 205 may generate other encoded symbols 240 in a similar manner. Additionally, it should be noted that, in some examples, a source symbol 230 (e.g., S1) may be used in generating multiple encoded symbols 240-*a* according to a uniform distribution. Generating multiple encoded symbols 240-*a* according to a uniform distribution may involve each source symbol 230 being used for encoding an approximately equal number of times.

The degree distribution may be an ideal Soliton distribution or a robust Soliton distribution. The equations governing an ideal Soliton distribution may be $\rho(1) = 1/k$ and $$\rho(d) = \frac{1}{d(d-1)}, d = 2, 3, 4 \ldots, k.$$

The equations governing a robust Soliton distribution may be $$\mu(i) = \frac{\rho(i) + \tau(i)}{\sum_{j=1}^{k} \rho(j) + \tau(j)},$$

where $\tau(i) = \frac{R}{ik}$ for $i = 1, 2, \ldots, \frac{k}{R} - 1; \frac{R}{k}\ln\left(\frac{R}{\delta}\right)$ for $i = \frac{k}{R}$;

and 0 otherwise and where $$R = c\sqrt{k}\ln\left(\frac{k}{\delta}\right).$$

When using a solution distribution, the expected or average degree of an encoded symbol 240 may be ln (k).

Upon generating the first set of encoded symbols 240, encoding device 205 may transmit the first set of encoded symbols 240 to decoding device 210 via encoded transmission 215. Decoding device 210 may receive encoded symbols 240-*a* and 240-*b*, but may fail to receive encoded symbols 240-*c*. Using encoded symbols 240-*a* and 240-*b* (e.g., among other encoded symbols 240), decoding device 210 may recover at least some of the set of source symbols 230. For instance, in the present example, decoding device 210 may recover source symbols S1, S2, S3, and S5. However, decoding device 210 may fail to recover source symbols S4 and S6.

After recovering the source symbols 230, decoding device 210 may provide feedback 220 to encoding device 205. Generally, the feedback 220 may include an indication of one or more source symbols 230 that are in a set W. In one example, W may include each source symbol 230 successfully recovered by decoding device 210. For instance, W may include an indication of S1, S2, S3, and S5 and feedback 220 may include an individual indication for each of S1, S2, S3, and S5.

In another example, W may include source symbols 230 whose respective source symbol set 235 had each source symbol 230 of the source symbol set 235 successfully recovered. For instance, in the present example, W may include S1 and S2 because each source symbol 230 of source symbol set 235-*a*, which may include S1 and S2, may have been successfully recovered. W may not, however, include S3 and S5 as not each source symbol 230 of source symbol set 235-*b* (e.g., which may include S3 and S4) and each source symbol 230 of source symbol set 235-*b* (e.g., which may include S5 and S6) was successfully recovered. Indicating W in such an example may involve transmitting an indication of the source symbol set 235 (e.g., not indications of individual source symbols 230). By providing limited feedback (e.g., reporting source symbol sets 235) the overhead associated with the feedback 220 may be reduced.

In yet another example, W may include only source symbols 230 that map to an encoded symbol 240 with a degree whose value is one (e.g., degree-1 encoded symbols 240). In the present example, encoded symbol 240-*a* may have a degree of one and may map to S1. As such, in the present example, W may include S1. S2, S3, and S5, although successfully recovered, may not be in W, as S2, S3, and S5 may not map to an encoded symbol 240 with a degree whose value is one. Additionally or alternatively, the decoding device 210 may perform online decoding with a BP process may add the decoded or recovered degree-1 encoded symbols 240 to the set W (e.g., the BP process may begin when N encoded symbols 240 are received).

In some cases, the decoding device 210 may report the feedback 220 according to a feedback period T. The feedback period may be determined by the encoding device 205 or decoding device 210 as a number T of encoded symbols 240 sent by the encoding device 205. Additionally or alternatively, the feedback period may be determined by the encoding device 205 or decoding device 210 as a number T of encoded symbols 240 received by the decoding device 210. Additionally or alternatively, the feedback period may be determined by the encoding device 205 or the decoding device 210 as a function T (k), where k may represent the number of encoded symbols 240 transmitted by the encoding device 205 during a previous feedback time. Additionally or alternatively, the feedback period may be determined by the encoding device 205 or the decoding device 210 as a function T (k), where k may represent the number of encoded symbols 240 received by the decoding device 210 during a previous feedback time.

To enable encoding device 205 to determine the feedback period, the decoding device 210 may transmit an indication of the number of encoded symbols 240 received during the previous feedback time or via encoded transmission 215. To enable decoding device 210 to determine the feedback period, the encoding device 205 may transmit an indication of the number of encoded symbols 240 transmitted during the previous feedback time or via encoded transmission 215. If encoding device 205 determines the feedback period, encoding device 205 may transmit an indication of the feedback period to decoding device 210. If decoding device 210 determines the feedback period, decoding device 210 may transmit an indication of the feedback period to encoding device 205.

Upon receiving the feedback 220, encoding device 205 may determine which source symbols 230 are in W. For instance, in the present example, W may include source symbols 230 whose respective source symbol set 235 had each source symbol 230 of the source symbol set 235 successfully recovered. As such, encoding device 205 may determine that W includes S1 and S2.

Using the feedback 220, the encoding device 205 may convert the source symbols 230 to a second set of encoded symbols 240. A first method by which the encoding device 205 may generate an encoded symbol 240 may involve using the same degree distribution as used to generate each encoded symbol 240 of the first set. In such a method, encoding device 205 may identify a degree of the degree distribution and may select among any of the original set of source symbols 230 (e.g., S1-S6). However, source symbols 230 selected by the encoding device 205 that are in W may not be used to generate the corresponding encoded symbol 240. For instance, to generate encoded symbol 240-d, encoding device 205 may identify a degree of two from a degree distribution and may select two source symbols 230 accordingly (e.g., S1 and S3). However, as S1 is in W, encoded symbol 240-d may be S3. As such, the effective degree of encoded symbol 240-d may be 1, even though the identified degree was 2.

Additionally, to generate encoded symbol 240-e, encoding device 205 may identify a degree of three from a degree distribution and may select three source symbols 230 accordingly (e.g., S2, S5, and S6). The encoding device 205 may combine S5 and S6 together (e.g., via an XOR operation) to generate encoded symbol 240-e, but may refrain from combining S2 with S5 and S6, as S2 may be in W. As such, the effective degree of encoded symbol 240-e may be 2, even though the identified degree was 3. Additionally, to generate encoded symbol 240-f, encoding device 205 may identify a degree of two from a degree distribution; may select two source symbols 230 accordingly (e.g., S4 and S6); and may combine the source symbols 230 together (e.g., via an XOR operation) to generate encoded symbol 240-f. The effective degree of encoded symbol 240-f may be 2, as no source symbols 230 in W were selected for encoded symbol 240-f. Encoding device 205 may generate other encoded symbols 240 in a similar manner. More details about this method may be described with reference to FIG. 4.

A second method by which the encoding device 205 may generate an encoded symbol 240 may involve selecting only among the source symbols 230 not in W. As encoding device 205 may be selecting among fewer source symbols 230 (e.g., the number of source symbols 230 not in W may be less than the total number of source symbols 230), encoding device 205 may use a different degree distribution as compared to when generating the first set of encoded symbols 240 for encoded transmission 215. The different degree distribution may have a lower average degree than the original degree distribution. For instance, to generate encoded symbol 240-d, encoding device 205 may identify a degree of one from the different degree distribution and may select one source symbol 230 not in W accordingly (e.g., S3). Additionally, to generate encoded symbol 240-e, encoding device 205 may identify a degree of two from the different degree distribution and may select two source symbols 230 not in W accordingly (e.g., S5 and S6). The encoding device 205 may combine S5 and S6 together (e.g., via an XOR operation) to generate encoded symbol 240-e. Additionally, to generate encoded symbol 240-f, encoding device 205 may identify a degree of two from a degree distribution; may select two source symbols 230 not in W accordingly (e.g., S4 and S6); and may combine the source symbols 230 together (e.g., via an XOR operation) to generate encoded symbol 240-f. Encoding device 205 may generate other encoded symbols 240 in a similar manner. More details about this method may be described with reference to FIG. 5.

Whether the encoding device 205 performs the first or second method may depend on whether a number of encoded symbols 240 transmitted via encoded transmission 215 satisfies a threshold. For instance, if the number of encoded symbols 240 is greater than the threshold, then the encoding device 205 may perform the first method, and if the number of encoded symbols 240 is less than the threshold, then the encoding device 205 may perform the second method. Alternatively, if the number of encoded symbols 240 is less than the threshold, then the encoding device 205 may perform the first method, and if the number of encoded symbols 240 is greater than the threshold, then the encoding device 205 may perform the second method.

Additionally or alternatively, whether the encoding device 205 performs the first or second method may depend on whether a number of encoded symbols 240 received by the decoding device 210 when the decoding device receives encoded transmission 215 satisfies a threshold. For instance, if the number of encoded symbols 240 is greater than the threshold, then the encoding device 205 may perform the first method, and if the number of encoded symbols 240 is less than the threshold, then the encoding device 205 may perform the second method. Alternatively, if the number of encoded symbols 240 is less than the threshold, then the encoding device 205 may perform the first method, and if the number of encoded symbols 240 is greater than the threshold, then the encoding device 205 may perform the second method. The decoding device 210 may signal the number of encoded symbols successfully received to the encoding device 205.

As the average degree of the encoded symbols 240 rise, the computational complexity associated with decoding that symbol may also increase (e.g., the computational complexity may be dependent on the average degree of the encoded symbols 240). As such, in cases where the average degree of a distribution is higher, a greater latency may be associated with decoding the encoded symbols 240. Thus, methods which decrease the average degree of the encoded symbols may decrease latency. The first method may lower the average degree by decreasing the effective degree of each encoded source symbol 240, even though the degree distribution may be unchanged. The second method may lower the average degree by the different degree distribution having a lower average degree as compared to the original degree distribution. Generally, the methods as described herein may lower the encoding or decoding complexity by reducing a number of symbol operations. A symbol operation may include an XOR of one symbol into another or a copy of one symbol into another.

Figure 3:
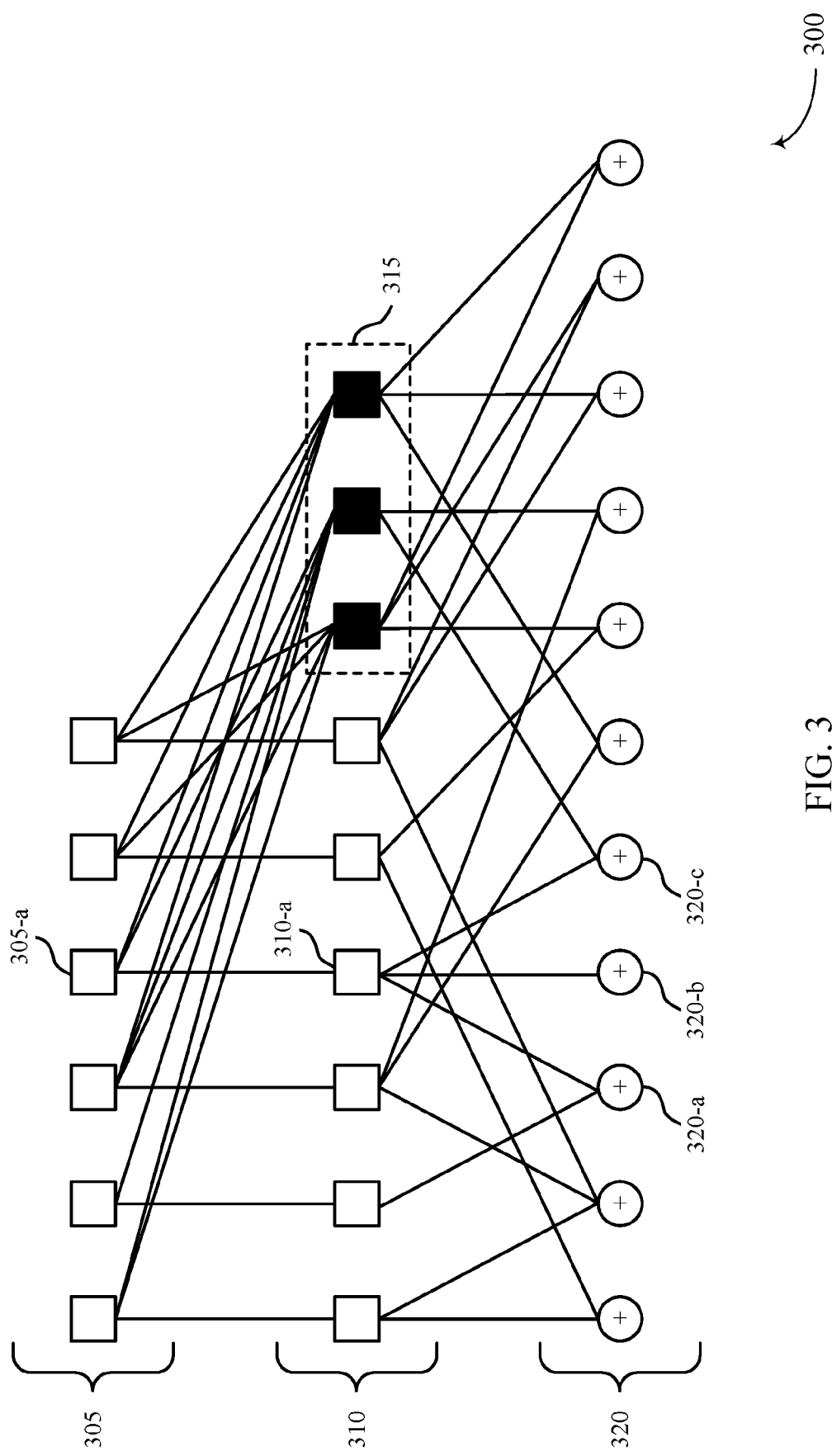
FIG. 3 illustrates an example of a raptor encoding procedure that supports raptor code feedback in accordance with aspects of the present disclosure.

FIG. 3 illustrates an example of a raptor encoding procedure 300 that supports raptor code feedback in accordance with aspects of the present disclosure. In some examples, raptor encoding procedure 300 may implement aspects of wireless communications system 200. For instance, raptor encoding procedure 300 may be an example of a procedure by which an encoding device 205 may encode source symbols.

Initially, an encoding device 205 may have a set of source symbols 305. As part of a pre-coding process, encoding device 205 may generate intermediate symbols 310. Generating intermediate symbols 310 may involve mapping each source symbol 305 to a unique intermediate symbol 310. For instance, source symbol 305-a may map to intermediate symbol 310-a. Additionally, generating intermediate symbols may involve mapping multiple source symbols 305 to each of a set of redundant intermediate symbols 315, which may also be referred to as redundant nodes. The redundant intermediate symbols 315 may include S low-density parity check (LDPC) symbols (e.g., where each source symbol 305 may appear three times over the S LDPC symbols). Additionally or alternatively, the redundant intermediate symbols 315 may include H half symbols (e.g., where each encoded symbol 320 may include ceiling (H/2) source symbols 305). It should be noted that the source symbols 230 as described in FIG. 2 may correspond to source symbols 305 or intermediate symbols 310.

As part of a Luby transform (LT) coding process, the encoding device 205 may generate encoded symbols 320. Generating the encoded symbols may involve choosing a degree $d_i$ from a degree distribution; choosing or selecting $d_i$ distinct intermediate symbols 310 according to a uniform distribution; and combining them (e.g., performing one or more XORs). Using a uniform distribution may ensure that each intermediate symbol 310 is selected approximately a same amount. In one example, encoding device 205 may identify a degree of two; may select intermediate symbol 310-a and another intermediate symbol 310; and may combine (e.g., XOR) them to generate encoded symbol 320-a. In another example, encoding device 205 may identify a degree of one; may select intermediate symbol 310-a and may use intermediate symbol 310-a as encoded symbol 320-b. In yet another example, encoding device 205 may identify a degree of three; may select intermediate symbol 310-a and two other intermediate symbols 310; and may combine (e.g., XOR) them to generate encoded symbol 320-c. Encoded symbols 320 may correspond to encoded symbol 240 as described with reference to FIG. 2.

Figure 4:
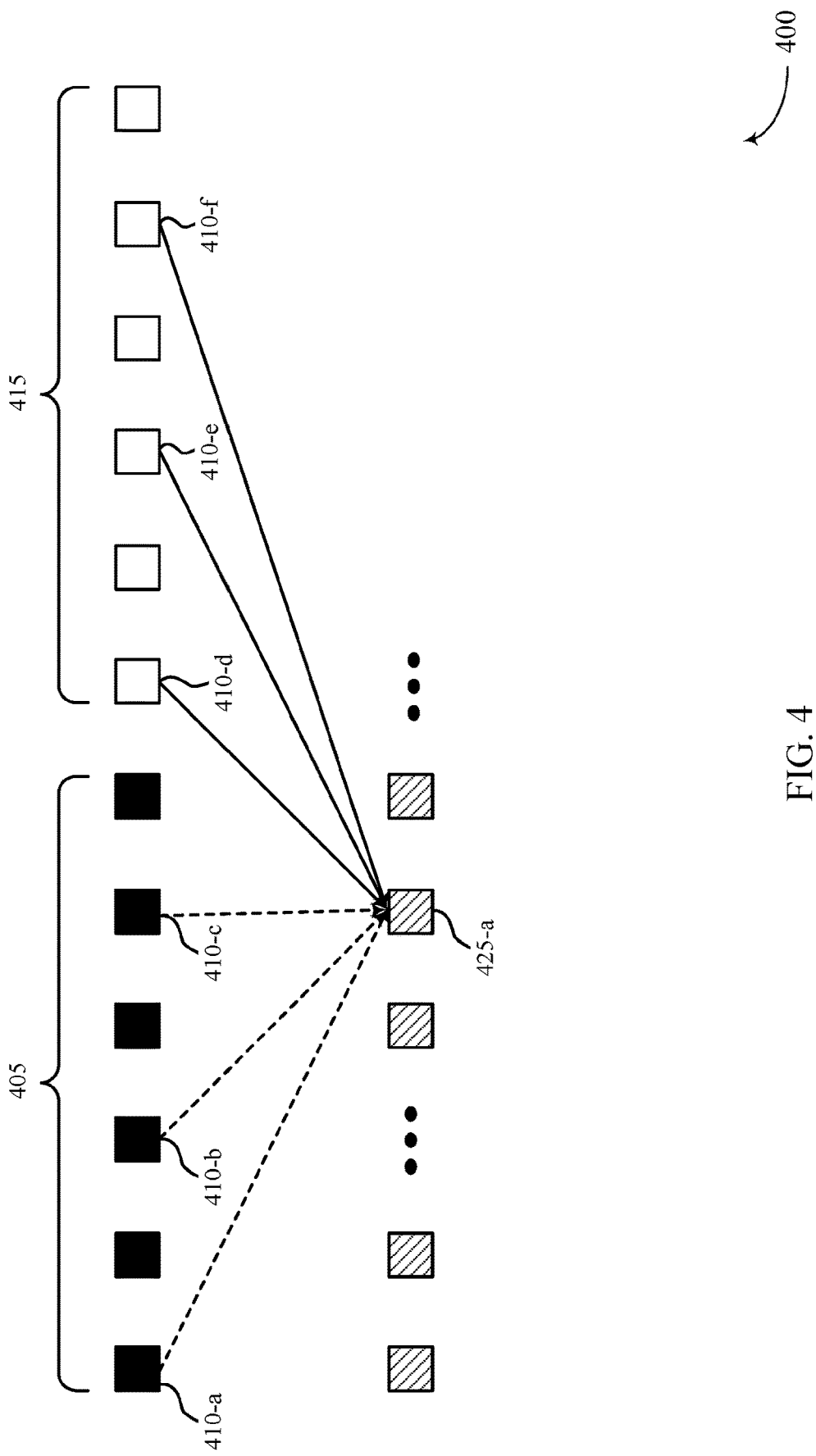
FIG. 4 illustrates an example of an encoding scheme that supports raptor code feedback in accordance with aspects of the present disclosure.

FIG. 4 illustrates an example of an encoding scheme 400 that supports raptor code feedback in accordance with aspects of the present disclosure. In some examples, encoding scheme 400 may implement aspects of wireless communications system 200. For instance, encoding scheme 400 may be an example of a scheme by which an encoding device 205 may encode source symbols after receiving feedback 220 from a decoding device 210.

After receiving feedback 220 from a decoding device 210, the encoding device 205 may determine a set W 405 of source symbols 410, which may include source symbols 410-a, 410-b, and 410-c. The remaining source symbols 410 may be in not-W 415, which may include source symbols 410-d, 410-e, and 410-f. Source symbols 410 may be an example of a source symbol 230 as described with reference to FIG. 2, or a source symbol 305 or intermediate symbol 310 as described with reference to FIG. 3.

One method by which the encoding device 205 may generate an encoded symbol 425 may involve the encoding device 205 randomly choosing (e.g., selecting, identifying) a degree $d_i$ from a degree distribution (e.g., a Solution distribution with parameter K, where K may be the number of source symbols 310 in W 405 and not-W 415). The encoding device may select $d_i$ source symbols 410 with uniform distribution and may combine (e.g., XOR) the source symbols that are in not-W 415. Encoded symbols 425 may be an example of an encoded symbol 240 as described with reference to FIG. 2 or an encoded symbol 320 as described with reference to FIG. 3.

In one example, an encoding device may choose (e.g., select, identify) a degree of six and may select six source symbols 410 accordingly. Some of the six source symbols 410 may be in W 405 (e.g., source symbols 410-a, 410-b, and 410-c) and some of the six source symbols 410 may be in not-W 415 (e.g., source symbols 410-d, 410-e, and 410-f). The encoding device 205 may combine (e.g., XOR) the source symbols in not-W 415 (e.g., source symbols 410-d, 410-e, and 410-f) to generate an encoded symbol 425 (e.g., encoded symbol 425-a). As such, even though the chosen degree was 6, the effective degree of the encoded symbol 425 may be three.

Performing the method as described herein may reduce the number of symbol operations in the encoding and decoding process. Additionally, in cases where each of the selected symbols are in W 405, it may be redundant encoding symbols in the decoding process.

Figure 5:
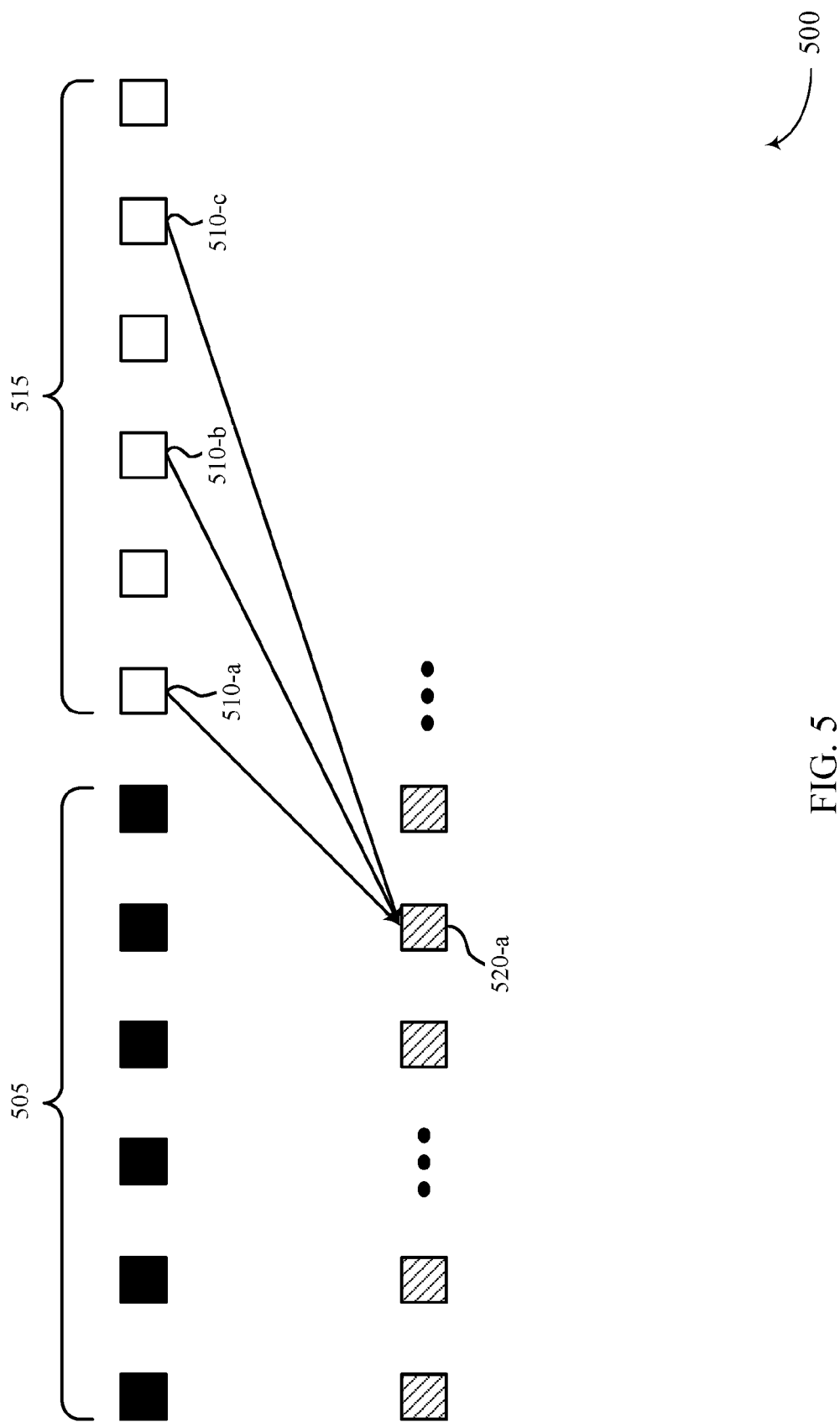
FIG. 5 illustrates an example of an encoding scheme that supports raptor code feedback in accordance with aspects of the present disclosure.

FIG. 5 illustrates an example of an encoding scheme 500 that supports raptor code feedback in accordance with aspects of the present disclosure. In some examples, encoding scheme 500 may implement aspects of wireless communications system 200. For instance, encoding scheme 500 may be an example of a scheme by which an encoding device 205 may encode source symbols after receiving feedback 220 from a decoding device 210.

After receiving feedback 220 from a decoding device 210, the encoding device 205 may determine a set W 505 of source symbols 510. The remaining source symbols 510 may be in not-W 515, which may include source symbols 510-a, 510-b, and 510-c. Source symbols 510 may be an example of a source symbol 230 as described with reference to FIG. 2, or a source symbol 305 or intermediate symbol 310 as described with reference to FIG. 3.

One method by which the encoding device 205 may generate an encoded symbol 520 may involve the encoding device 205 randomly choosing (e.g., selecting, identifying) a degree $d_i$ from a degree distribution (e.g., a Solution distribution with parameter K', where K' is the number of source symbols that are in not-W 515). The encoding device may select $d_i$ source symbols 510 with uniform distribution and may combine (e.g., XOR) them. Encoded symbols 520 may be an example of an encoded symbol 240 as described with reference to FIG. 2 or an encoded symbol 320 as described with reference to FIG. 3.

In one example, an encoding device may choose (e.g., select, identify) a degree of three and may select three source symbols 510 (e.g., source symbols 510-a, 510-b, and 510-c) in not-W 515 accordingly. The encoding device 205 may combine (e.g., XOR) the three source symbols 510 (e.g., source symbols 510-a, 510-b, and 510-c) to generate an encoded symbol 520 (e.g., encoded symbol 520-a).

Performing the method as described herein may reduce the number of symbol operations in the encoding and decoding process. For instance, if encoding each of source symbols 510 in W 505 and not-W 515, of which there may be K source symbols 510, the number of symbol operations in encoding or decoding may be ln (K). However, if encoding source symbols in not-W 515 and not those in W 505, the number of symbol operations in encoding or decoding may be ln (K'), where ln(K')≤ln (K).

Figure 6:
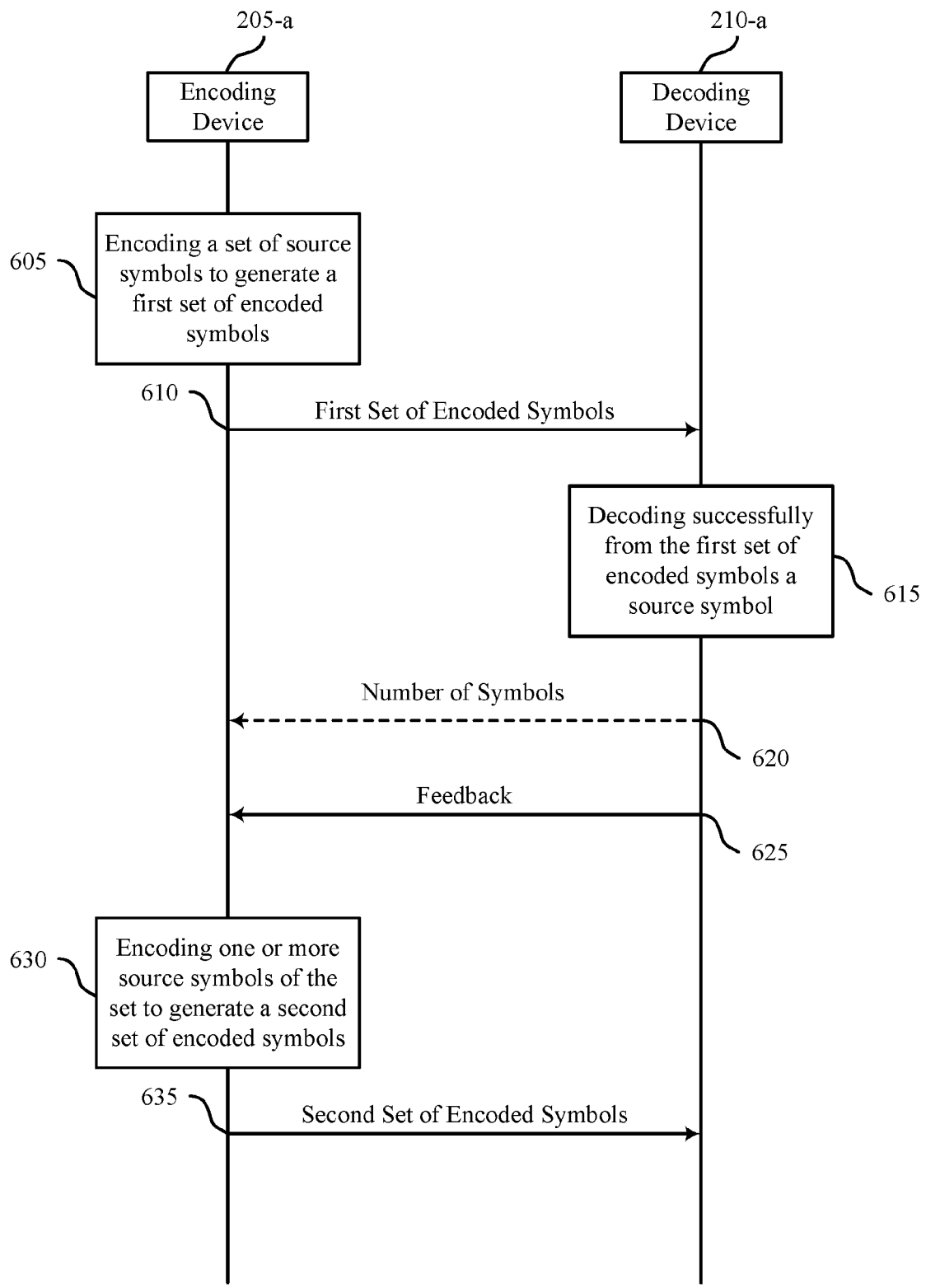
FIG. 6 illustrates an example of a process flow that supports raptor code feedback in accordance with aspects of the present disclosure.

FIG. 6 illustrates an example of a process flow 600 that supports raptor code feedback in accordance with aspects of the present disclosure. In some examples, process flow 600 may implement aspects of wireless communications system 200. For instance, encoding device 205-a may be an example of an encoding device 205 as described with reference to FIG. 2 and decoding device 210-a may be an example of a decoding device 210 as described with reference to FIG. 2.

At 605, encoding device 205-*a* may encode a set of source symbols using one or more raptor codes to generate a first set of encoded symbols.

At 610, encoding device 205-*a* may transmit the first set of encoded symbols. Decoding device 210-*a* may receive the first set of encoded symbols.

At 615, decoding device 210-*a* may recover successfully from the first set of encoded symbols a source symbol of the set of source symbols associated with the first set of encoded symbols. For instance, by performing BP decoding, decoding device 210-*a* may determine a value of a source symbol of the set of source symbols used by encoding device 205-*a* to generate the first set of encoded symbols.

At 620, decoding device 210-*a* may transmit an indication of a number of symbols to encoding device 205-*a*. The number of symbols may be a number of symbols in the first set of encoded symbols that were successfully received by decoding device 210-*a*. Additionally or alternatively, the number of symbols may be a number of symbols in a third set of encoded symbols successfully received, where decoding device 210-*a* received the third set of encoded symbols before receiving the first set of encoded symbols. Receiving the number of symbols may enable encoding device 205-*a* to determine whether to generate a second set of encoded symbols according to a first method or a second method (e.g., the first and second method as described with reference to FIG. 2).

In some cases, encoding device 205-*a* may determine a feedback period. Encoding device 205-*a* may determine the feedback period based on a number of symbols in the first set of encoded symbols. Additionally or alternatively, encoding device 205-*a* may determine the feedback period based on receiving an indication of a number of symbols in the first set of encoded symbols successfully received (e.g., the indication received at 620). In some cases, encoding device 205-*a* may determine the feedback period based on a number of symbols in a third set of encoded symbols, where encoding device 205-*a* may transmit the third set of encoding symbols before transmitting the first set of encoded symbols. Additionally or alternatively, encoding device 205-*a* may determine the feedback period based on an indication of a number of symbols in a third set of encoded symbols successfully received (e.g., the indication received at 620), where encoding device 205-*a* may transmit the third set of encoded symbols before transmitting the first set of encoded symbols.

In some cases, decoding device 210-*a* may determine a feedback period (e.g., a time for transmitting the indication of the feedback at 625). Decoding device 210-*a* may determine the feedback period based on a number of symbols in the first set of encoded symbols. Additionally or alternatively, decoding device 210-*a* may determine the feedback period based on a number of symbols in a third set of encoded symbols, where decoding device 210-*a* received the third set of encoded symbols before receiving the first set of encoded symbols.

At 625, decoding device 210-*a* may transmit feedback to encoding device 205-*a*. For instance, decoding device 210-*a* may transmit an indication of the source symbol based on recovering (or decoding) the source symbol. In some cases, transmitting the indication of the source symbol may involve decoding device 210-*a* transmitting an indication of a subset of the set of source symbols that includes the source symbol, each source symbol of the subset successfully recovered from the first set of encoded symbols. In some cases, decoding device 210-*a* may transmit an indication of a second subset of the set of source symbols after receiving the first set of encoded symbols. In some cases, the subset of source symbols and the second subset of source symbols may be indicated in a single message. In some cases, encoding device 205-*a* may receive the feedback based on determining the feedback period. In some cases, each source symbol of the subset may have an associated degree whose value is one. In such cases, decoding device 210-*a* may transmit an indication for each source symbol successfully recovered and that has an associated degree whose value is one and may refrain from transmitting an indication for each source symbol successfully recovered and that has an associated degree whose value is greater than one.

At 630, encoding device 205-*a* may encode one or more source symbols of the set of source symbols using the one or more raptor codes to generate a second set of encoded symbols based on receiving the indication of the source symbol. The one or more source symbols may exclude the source symbol based on receiving the indication of the source symbol at 625. Additionally or alternatively, the one or more source symbols may exclude each source symbol of the subset based on receiving the indication of the subset at 625. Encoding to generate an encoded symbol of the second set of encoded symbols may involve identifying a degree from a degree distribution; selecting at least one of the one or more source symbols from the set of source symbols according to the identified degree; and generating the encoded symbol based on the selected at least one of the one or more source symbols. In cases where encoding device 205-*a* receives the indication of the second subset of the set of source symbols, the one or more source symbols may exclude each source symbol of the second subset based on encoding device 205-*a* receiving the indication of the second subset.

In some cases, encoding device 205-*a* may select the successfully recovered source symbol (e.g., the symbol indicated by the indication received at 625) according to the identified degree and may refrain from combining the successfully recovered source symbol with the at least one of the one or more source symbols when generating the encoded symbol based on receiving the indication of the subset. In some cases, encoding device 205-*a* may select the successfully recovered source symbol based on the number of symbols indicated at 620. For instance, encoding device 205-*a* may select the successfully recovered source symbol based on the indicated number of symbols satisfying a threshold (e.g., being above or below the threshold). Additionally or alternatively, encoding device 205-*a* may select the successfully recovered source symbol based on a number of symbols in the first set of encoded symbols satisfying a threshold (e.g., being above or below the threshold). In cases where the successfully recovered source symbol is selectable, the degree distribution used to select the at least one of the one or more source symbols may also be used when encoding the set of source symbols to generate the first set of encoded symbols (e.g., encoding the set of source symbols at 605 may be based on the degree distribution).

In some cases, selecting the at least one of the one or more source symbols may involve encoding device 205-*a* selecting the at least one of the one or more source symbols from a second subset of the set of source symbols, where each source symbol of the subset (e.g., the subset indicated at 625) is excluded from the second subset. Additionally, the selecting may involve encoding device 205-*a* refraining from combining the successfully recovered source symbol with the at least one of the one or more source symbols when generating the encoded symbol and based on selecting from the second subset. In cases where encoding device 205-*a* receives the indication of the number of symbols transmitted at 620, encoding device 205-a may select the at least one of the one or more source symbols from the second subset based on the indicated number of symbols. In such cases, selecting the at least one of the one or more source symbols from the second subset may be based on the indicated number of symbols satisfying a threshold (e.g., being above or below the threshold). Additionally or alternatively, selecting the at least one of the one or more source symbols from the second subset may be based on a number of symbols in the first set of encoded symbols satisfying a threshold. In cases where the successfully recovered source symbol is not selectable, a the degree distribution used when encoding the one or more source symbols may be distinct from a second degree distribution used when encoding the set of source symbols.

At 635, encoding device 205-a may transmit the second set of encoded symbols. Decoding device 210-a may receive the second set of encoded symbols.

Figure 7:
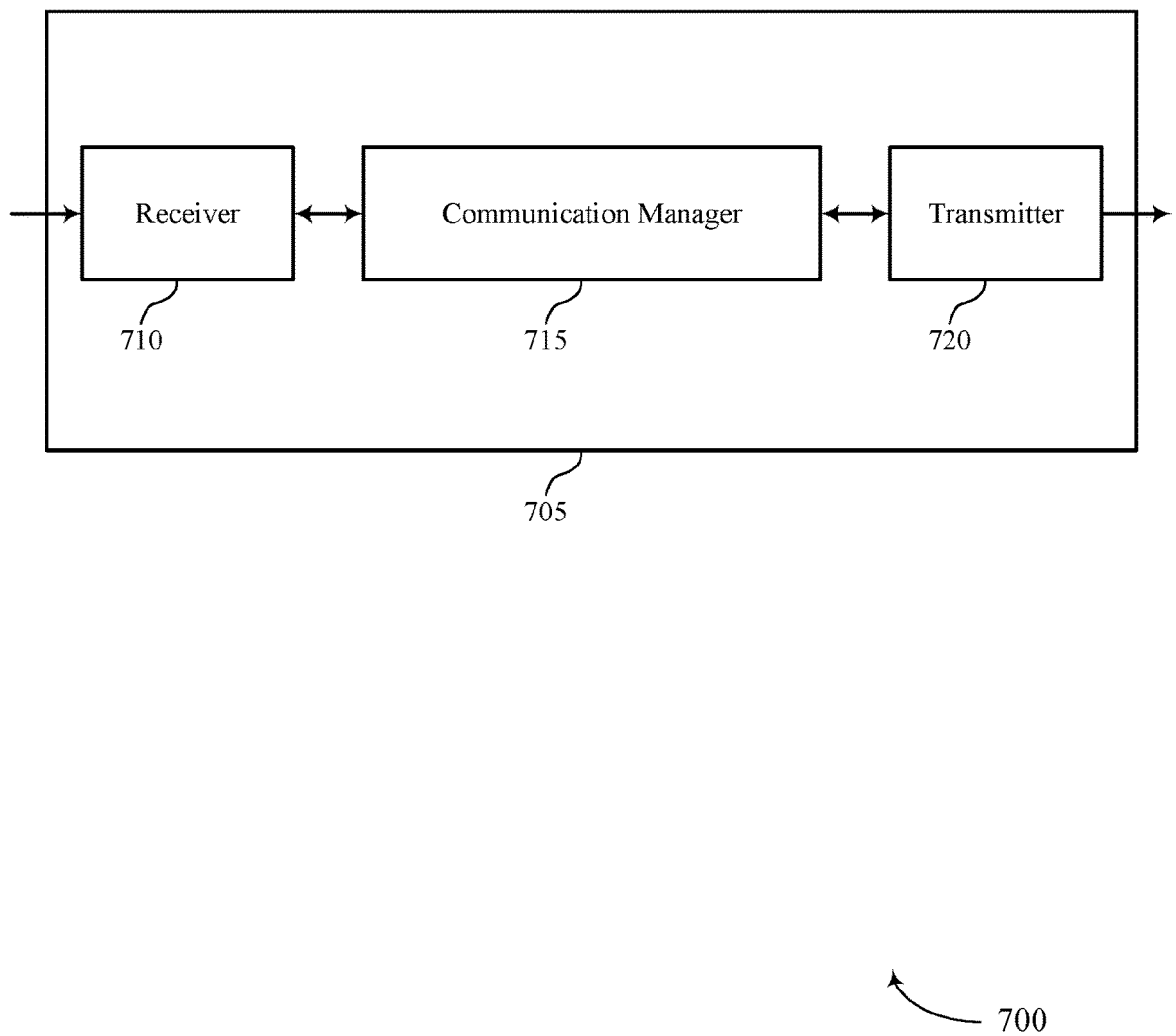
FIGS. 7 and 8 show block diagrams of devices that support raptor code feedback in accordance with aspects of the present disclosure.

FIG. 7 shows a block diagram 700 of a device 705 that supports raptor code feedback in accordance with aspects of the present disclosure. The device 705 may be an example of aspects of a UE 115 or base station 105 as described herein. The device 705 may include a receiver 710, a communication manager 715, and a transmitter 720. The device 705 may also include a processor. Each of these components may be in communication with one another (e.g., via one or more buses).

The receiver 710 may receive information such as packets, user data, or control information associated with various information channels (e.g., control channels, data channels, and information related to raptor code feedback, etc.). Information may be passed on to other components of the device 705. The receiver 710 may be an example of aspects of the transceiver 1015 described with reference to FIG. 10. The receiver 710 may utilize a single antenna or a set of antennas.

The communication manager 715 may encode a set of source symbols using one or more raptor codes to generate a first set of encoded symbols. The communication manager 715 may transmit the first set of encoded symbols. The communication manager 715 may receive an indication of a source symbol of the set of source symbols successfully recovered from the first set of encoded symbols. The communication manager 715 may encode one or more source symbols of the set of source symbols using the one or more raptor codes to generate a second set of encoded symbols based on receiving the indication of the source symbol. The communication manager 715 may transmit the second set of encoded symbols.

The communication manager 715 may receive a first set of encoded symbols that is encoded according to one or more raptor codes. The communication manager 715 may successfully recover from the first set of encoded symbols a source symbol of a set of source symbols associated with the first set of encoded symbols. The communication manager 715 may transmit an indication of the source symbol based on recovering the source symbol. The communication manager 715 may receive a second set of encoded symbols based on transmitting the indication of the source symbol, the second set of encoded symbols encoded according to the one or more raptor codes and associated with one or more source symbols of the set of source symbols. The communication manager 715 may be an example of aspects of the communication manager 1010 or 1110 as described herein.

The communication manager 715, or its sub-components, may be implemented in hardware, code (e.g., software or firmware) executed by a processor, or any combination thereof. If implemented in code executed by a processor, the functions of the communication manager 715, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The communication manager 715, or its sub-components, may be physically located at various positions, including being distributed such that portions of functions are implemented at different physical locations by one or more physical components. In some examples, the communication manager 715, or its sub-components, may be a separate and distinct component in accordance with various aspects of the present disclosure. In some examples, the communication manager 715, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 720 may transmit signals generated by other components of the device 705. In some examples, the transmitter 720 may be collocated with a receiver 710 in a transceiver module. For example, the transmitter 720 may be an example of aspects of the transceiver 1015 described with reference to FIG. 10. The transmitter 720 may utilize a single antenna or a set of antennas.

Figure 8:
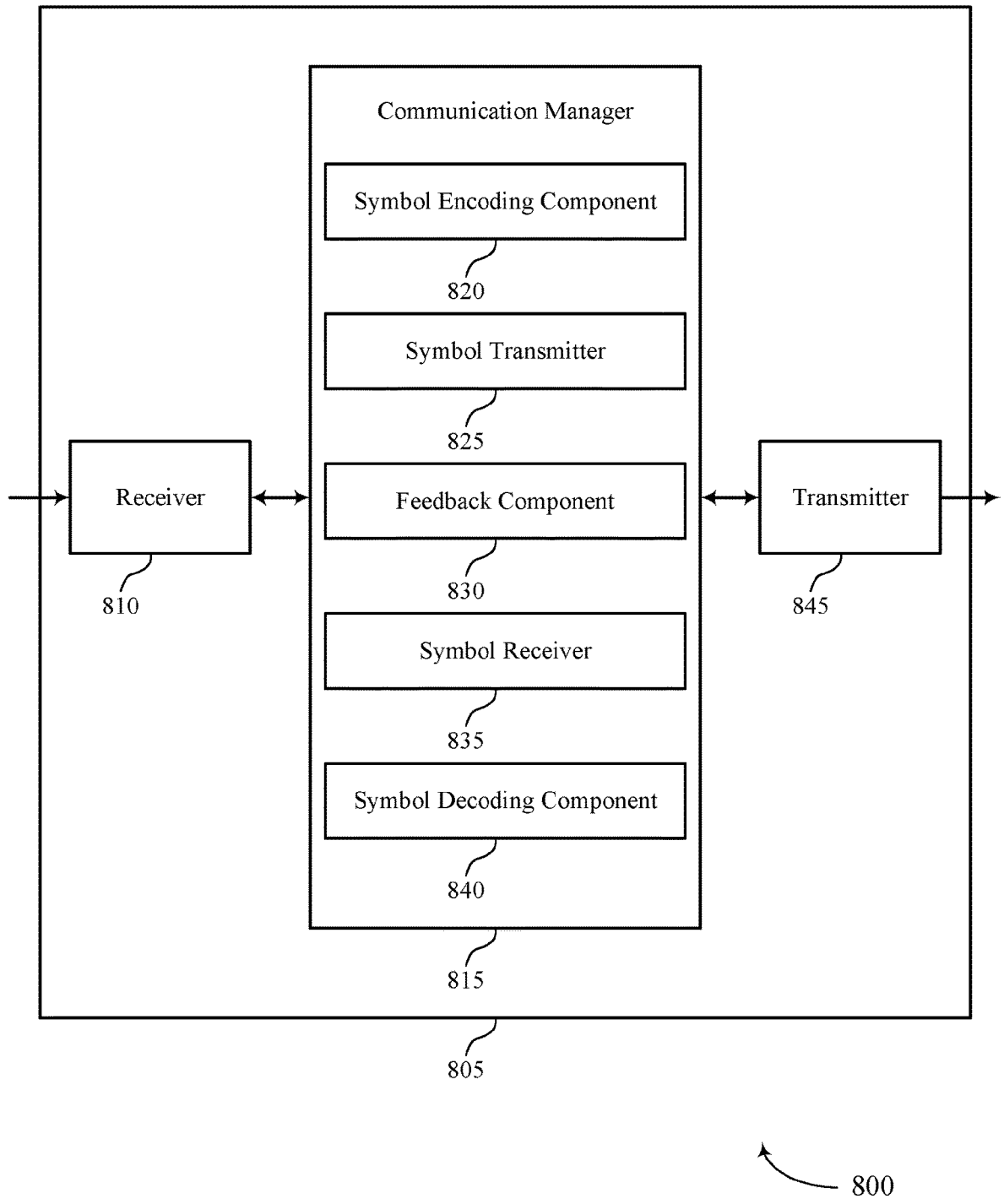

FIG. 8 shows a block diagram 800 of a device 805 that supports raptor code feedback in accordance with aspects of the present disclosure. The device 805 may be an example of aspects of a device 705, a UE 115, or a base station 105 as described herein. The device 805 may include a receiver 810, a communication manager 815, and a transmitter 845. The device 805 may also include a processor. Each of these components may be in communication with one another (e.g., via one or more buses).

The receiver 810 may receive information such as packets, user data, or control information associated with various information channels (e.g., control channels, data channels, and information related to raptor code feedback, etc.). Information may be passed on to other components of the device 805. The receiver 810 may be an example of aspects of the transceiver 1015 described with reference to FIG. 10. The receiver 810 may utilize a single antenna or a set of antennas.

The communication manager 815 may be an example of aspects of the communication manager 715 as described herein. The communication manager 815 may include a symbol encoding component 820, a symbol transmitter 825, a feedback component 830, a symbol receiver 835, and a symbol decoding component 840. The communication manager 815 may be an example of aspects of the communication manager 1010 or 1110 as described herein.

The symbol encoding component 820 may encode a set of source symbols using one or more raptor codes to generate a first set of encoded symbols and encode one or more source symbols of the set of source symbols using the one or more raptor codes to generate a second set of encoded symbols based on receiving the indication of the source symbol.

The symbol transmitter 825 may transmit the first set of encoded symbols and transmit the second set of encoded symbols.

The feedback component 830 may receive an indication of a source symbol of the set of source symbols successfully recovered from the first set of encoded symbols. The feedback component 830 may transmit an indication of the source symbol based on recovering the source symbol.

The symbol receiver 835 may receive a first set of encoded symbols that is encoded according to one or more raptor codes and receive a second set of encoded symbols based on transmitting the indication of the source symbol, the second set of encoded symbols encoded according to the one or more raptor codes and associated with one or more source symbols of the set of source symbols.

The symbol decoding component 840 may successfully recover from the first set of encoded symbols a source symbol of a set of source symbols associated with the first set of encoded symbols.

The transmitter 845 may transmit signals generated by other components of the device 805. In some examples, the transmitter 845 may be collocated with a receiver 810 in a transceiver module. For example, the transmitter 845 may be an example of aspects of the transceiver 1015 described with reference to FIG. 10. The transmitter 845 may utilize a single antenna or a set of antennas.

Figure 9:
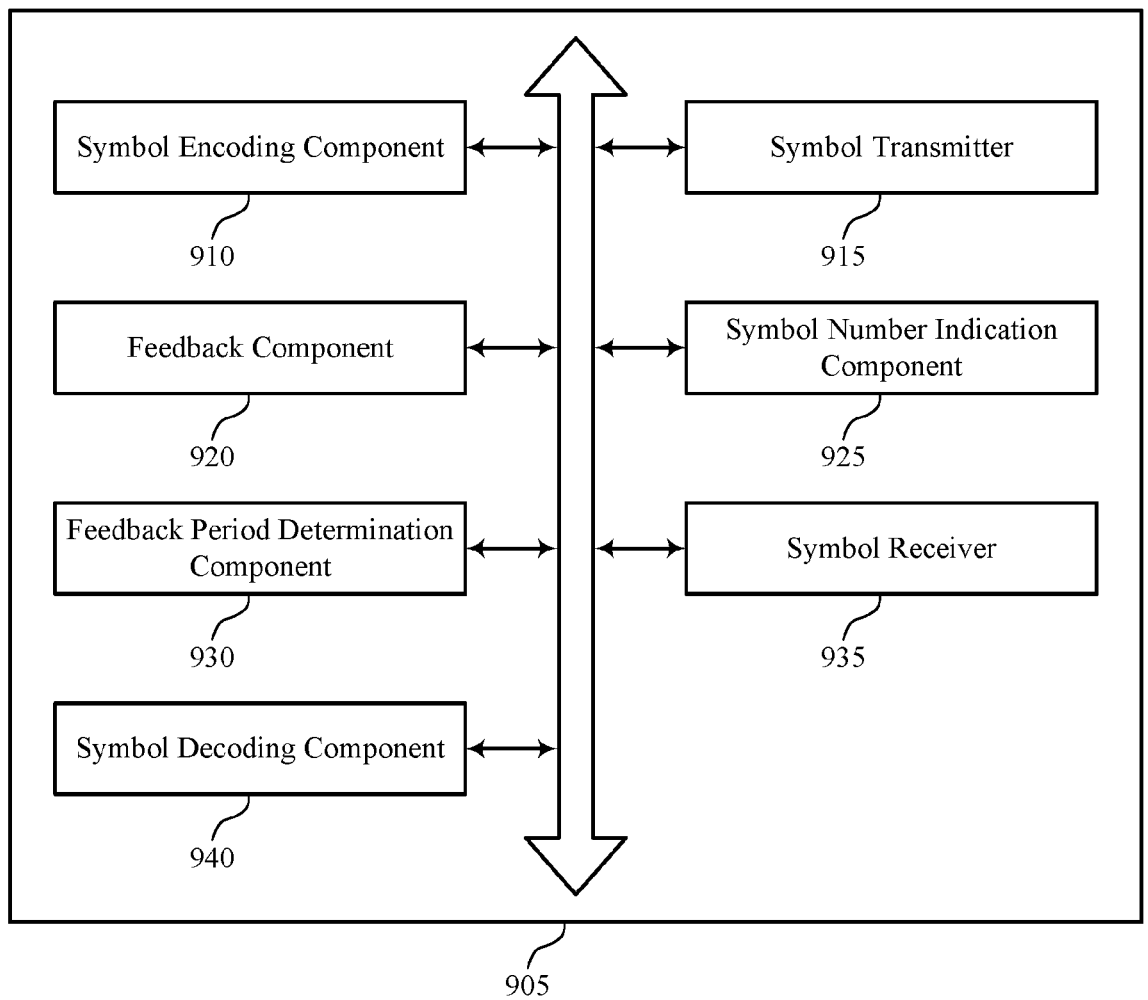
FIG. 9 shows a block diagram of a communication manager that supports raptor code feedback in accordance with aspects of the present disclosure.

FIG. 9 shows a block diagram 900 of a communication manager 905 that supports raptor code feedback in accordance with aspects of the present disclosure. The communication manager 905 may be an example of aspects of a communication manager 715, a communication manager 815, or a communication manager 1010 described herein. The communication manager 905 may include a symbol encoding component 910, a symbol transmitter 915, a feedback component 920, a symbol number indication component 925, a feedback period determination component 930, a symbol receiver 935, and a symbol decoding component 940. Each of these modules may communicate, directly or indirectly, with one another (e.g., via one or more buses).

The symbol encoding component 910 may encode a set of source symbols using one or more raptor codes to generate a first set of encoded symbols. In some examples, the symbol encoding component 910 may encode one or more source symbols of the set of source symbols using the one or more raptor codes to generate a second set of encoded symbols based on receiving the indication of the source symbol. In some examples, the symbol encoding component 910 may identify a degree from a degree distribution. In some examples, the symbol encoding component 910 may select at least one of the one or more source symbols from the set of source symbols according to the identified degree. In some examples, the symbol encoding component 910 may generate the encoded symbol based on the selected at least one of the one or more source symbols. The symbol encoding component 910 may identify the degree, select the at least one of the one or more source symbols, and generate the encoded symbol as part of encoding to generate the encoded symbol of the second set of encoded symbols. In some cases, encoding the set of source symbols is based on the degree distribution. In some cases, the degree distribution used when encoding the one or more source symbols is distinct from a second degree distribution used when encoding the set of source symbols.

In some examples, the symbol encoding component 910 may select the successfully recovered source symbol according to the identified degree. In some examples, the symbol encoding component 910 may refrain from combining the successfully recovered source symbol with the at least one of the one or more source symbols when generating the encoded symbol and based on receiving the indication of the subset. In some examples, the symbol encoding component 910 may select the successfully recovered source symbol based on the indicated number of symbols. In some cases, selecting the successfully recovered source symbol is based on the indicated number of symbols satisfying a threshold. In some cases, selecting the successfully recovered source symbol is based on a number of symbols in the first set of encoded symbols satisfying a threshold. In some examples, the symbol encoding component 910 selecting the at least one of the one or more source symbols may involve selecting the at least one of the one or more source symbols from a second subset of the set of source symbols, where each source symbol of the subset is excluded from the second subset. In some cases, selecting the at least one of the one or more source symbols from the second subset is based on a number of symbols in the first set of encoded symbols satisfying a threshold.

In some examples, the symbol encoding component 910 selecting the at least one of the one or more source symbols may involve refraining from combining the successfully recovered source symbol with the at least one of the one or more source symbols when generating the encoded symbol and based on selecting from the second subset. In some examples, the symbol encoding component 910 may select the at least one of the one or more source symbols from the second subset based on the indicated number of symbols. In some cases, selecting the at least one of the one or more source symbols from the second subset is based on the indicated number of symbols satisfying a threshold.

The symbol transmitter 915 may transmit the first set of encoded symbols. In some examples, the symbol transmitter 915 may transmit the second set of encoded symbols.

The feedback component 920 may receive an indication of a source symbol of the set of source symbols successfully recovered from the first set of encoded symbols. In some examples, the feedback component 920 may transmit an indication of the source symbol based on recovering the source symbol. In some examples, receiving the indication of the source symbol includes receiving an indication of a subset of the set of source symbols that includes the source symbol, each source symbol of the subset successfully recovered from the first set of encoded symbols. In some examples, the one or more source symbols may exclude each source symbol of the subset based on receiving the indication of the subset. In some examples, the one or more source symbols may exclude each source symbol of the subset based on transmitting the indication of the subset. In some cases, the one or more source symbols may exclude the source symbol based on receiving the indication of the source symbol. In some cases, the one or more source symbols may exclude the source symbol based on transmitting the indication of the source symbol.

In some examples, the feedback component 920 may receive an indication of a second subset of the set of source symbols after transmitting the first set of encoded symbols, where the one or more source symbols excludes each source symbol of the second subset based on receiving the indication of the second subset. In some examples, the feedback component 920 may transmit an indication of a second subset of the set of source symbols after receiving the first set of encoded symbols, where the one or more source symbols excludes each source symbol of the second subset based on transmitting the indication of the second subset. In some examples, the feedback component 920 transmitting the indication of the source symbol may involve transmitting an indication for each source symbol successfully recovered and that has an associated degree whose value is one. In such cases, the source symbol may have an associated degree whose value is one. In some examples, the feedback component 920 may refrain from transmitting an indication for each source symbol successfully recovered and that has an associated degree whose value is greater than one.

The symbol number indication component 925 may receive an indication of a number of symbols in the first set of encoded symbols that were successfully received. In some examples, the symbol number indication component 925 may receive an indication of a number of symbols in the first set of encoded symbols that were successfully received. In some examples, the symbol number indication component 925 may receive an indication of a number of symbols in the first set of encoded symbols successfully received. In some examples, the symbol number indication component 925 may receive an indication of a number of symbols in a third set of encoded symbols successfully received, where the third set of encoded symbols was transmitted before transmitting the first set of encoded symbols, and where determining the feedback period is based on receiving the number of symbols. In some examples, the symbol number indication component 925 may transmit an indication of a number of symbols in the first set of encoded symbols, where a time for transmitting the indication of the symbol is based on transmitting the indication of the number of symbols. In some examples, the symbol number indication component 925 may transmit an indication of a number of symbols in a third set of encoded symbols, where the third set of encoded symbols was received before the first set of encoded symbols, and where a time for transmitting the indication of the symbol is based on transmitting the indication of the number of symbols.

The feedback period determination component 930 may determine a feedback period, where receiving the indication of the source symbol is based on the determined feedback period. In some cases, determining the feedback period is based on a number of symbols in the first set of encoded symbols. In some cases, determining the feedback period may be based on a number of symbols in a third set of encoded symbols, where the third set of encoded symbols was transmitted before transmitting the first set of encoded symbols. In some cases, the feedback period is based on a number of symbols in a third set of encoded symbols, where the third set of encoded symbols was received before receiving the first set of encoded symbols. In some examples, the feedback period determination component 930 may determine the feedback period based on receiving the indication of the number of symbols. In some examples, the feedback period determination component 930 may determine a feedback period, where transmitting the indication of the source symbol is based on determining the feedback period.

The symbol receiver 935 may receive a first set of encoded symbols that is encoded according to one or more raptor codes. In some examples, the symbol receiver 935 may receive a second set of encoded symbols based on transmitting the indication of the source symbol, the second set of encoded symbols encoded according to the one or more raptor codes and associated with one or more source symbols of the set of source symbols.

The symbol decoding component 940 may successfully recover from the first set of encoded symbols a source symbol of a set of source symbols associated with the first set of encoded symbols. In some examples, successfully recover each source symbol of a subset of the set of source symbols, where transmitting the indication of the source symbol includes transmitting an indication of the subset.

Figure 10:
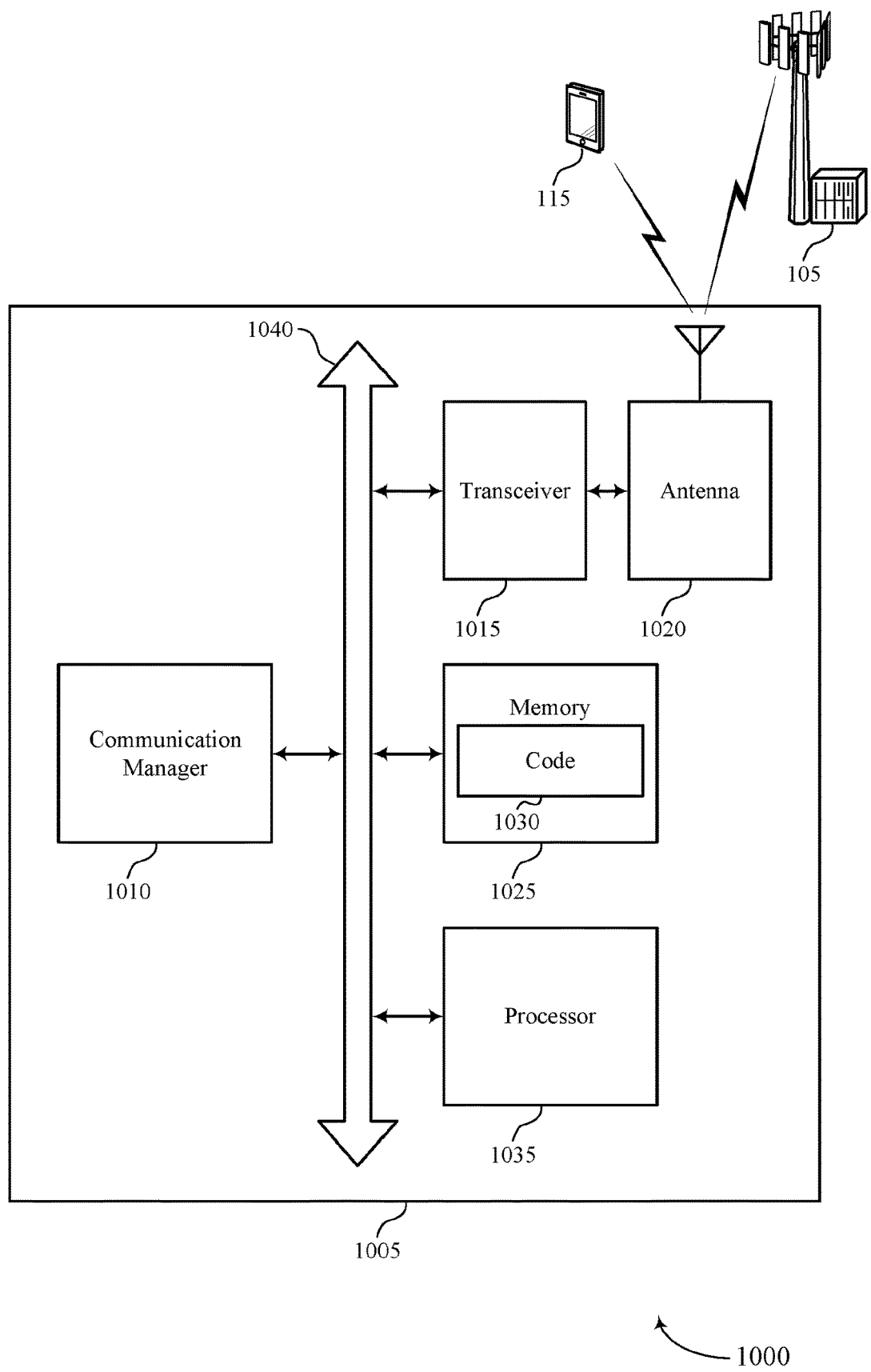
FIG. 10 shows a diagram of a system including a user equipment (UE) that supports raptor code feedback in accordance with aspects of the present disclosure.

FIG. 10 shows a diagram of a system 1000 including a device 1005 that supports raptor code feedback in accordance with aspects of the present disclosure. The device 1005 may be an example of or include the components of device 705, device 805, or a UE 115 as described herein. The device 1005 may include components for bi-directional voice and data communications including components for transmitting and receiving communications, including a communication manager 1010, a transceiver 1015, an antenna 1020, memory 1025, and a processor 1035. These components may be in electronic communication via one or more buses (e.g., bus 1040).

The communication manager 1010 may encode a set of source symbols using one or more raptor codes to generate a first set of encoded symbols. The communication manager 1010 may encode one or more source symbols of the set of source symbols using the one or more raptor codes to generate a second set of encoded symbols based on receiving the indication of the source symbol. The communication manager 1010 may transmit the first set of encoded symbols. The communication manager 1010 may transmit the second set of encoded symbols. The communication manager 1010 may receive an indication of a source symbol of the set of source symbols successfully recovered from the first set of encoded symbols. The communication manager 1010 may transmit an indication of the source symbol based on recovering the source symbol. The communication manager 1010 may receive a first set of encoded symbols that is encoded according to one or more raptor codes. The communication manager 1010 may receive a second set of encoded symbols based on transmitting the indication of the source symbol, the second set of encoded symbols encoded according to the one or more raptor codes and associated with one or more source symbols of the set of source symbols. The communication manager 1010 may successfully recover from the first set of encoded symbols a source symbol of a set of source symbols associated with the first set of encoded symbols.

The transceiver 1015 may communicate bi-directionally, via one or more antennas, wired, or wireless links as described herein. For example, the transceiver 1015 may represent a wireless transceiver and may communicate bi-directionally with another wireless transceiver. The transceiver 1015 may also include a modem to modulate the packets and provide the modulated packets to the antennas for transmission, and to demodulate packets received from the antennas.

In some cases, the wireless device may include a single antenna 1020. However, in some cases the device may have more than one antenna 1020, which may be capable of concurrently transmitting or receiving multiple wireless transmissions.

The memory 1025 may include random-access memory (RAM) and read-only memory (ROM). The memory 1025 may store computer-readable, computer-executable code 1030 including instructions that, when executed, cause the processor to perform various functions described herein. In some cases, the memory 1025 may contain, among other things, a basic input/output system (BIOS) which may control basic hardware or software operation such as the interaction with peripheral components or devices.

The code 1030 may include instructions to implement aspects of the present disclosure, including instructions to support wireless communications. The code 1030 may be stored in a non-transitory computer-readable medium such as system memory or other type of memory. In some cases, the code 1030 may not be directly executable by the processor 1035 but may cause a computer (e.g., when compiled and executed) to perform functions described herein.

The processor 1035 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1035 may be configured to operate a memory array using a memory controller. In other cases, a memory controller may be integrated into the processor 1035. The processor 1035 may be configured to execute computer-readable instructions stored in a memory (e.g., the memory 1025) to cause the device 1005 to perform various functions (e.g., functions or tasks supporting raptor code feedback).

Figure 11:
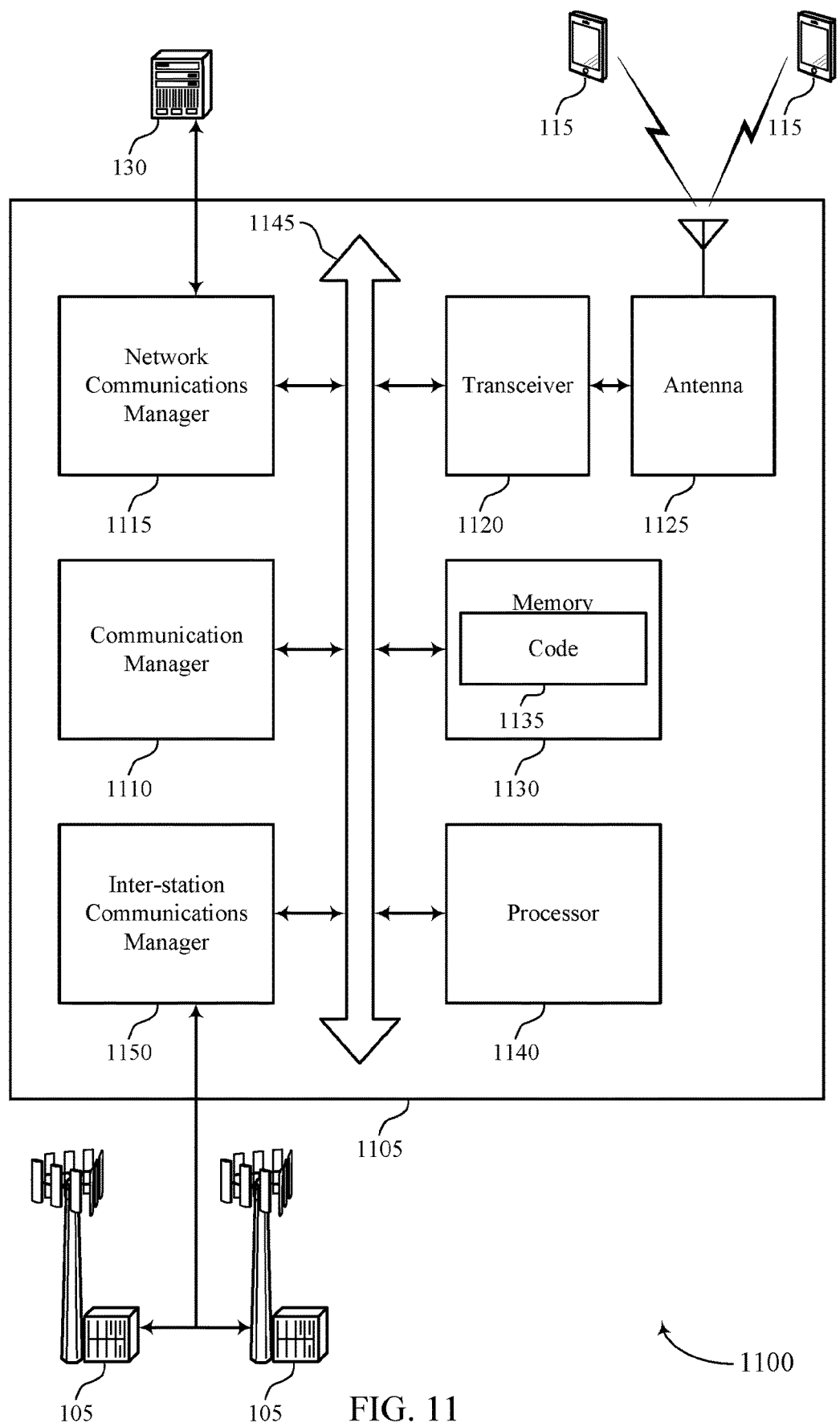
FIG. 11 shows a diagram of a system including a base station that supports raptor code feedback in accordance with aspects of the present disclosure.

FIG. 11 shows a diagram of a system 1100 including a device 1105 that supports raptor code feedback in accordance with aspects of the present disclosure. The device 1105 may be an example of or include the components of device 705, device 805, or a base station 105 as described herein. The device 1105 may include components for bi-directional voice and data communications including components for transmitting and receiving communications, including a communication manager 1110, a network communications manager 1115, a transceiver 1120, an antenna 1125, memory 1130, and a processor 1140. These components may be in electronic communication via one or more buses (e.g., bus 1145).

The communication manager 1110 may encode a set of source symbols using one or more raptor codes to generate a first set of encoded symbols. The communication manager 1110 may encode one or more source symbols of the set of source symbols using the one or more raptor codes to generate a second set of encoded symbols based on receiving the indication of the source symbol. The communication manager 1110 may transmit the first set of encoded symbols. The communication manager 1110 may transmit the second set of encoded symbols. The communication manager 1110 may receive an indication of a source symbol of the set of source symbols successfully recovered from the first set of encoded symbols. The communication manager 1110 may also transmit an indication of the source symbol based on recovering the source symbol. The communication manager 1110 may receive a first set of encoded symbols that is encoded according to one or more raptor codes. The communication manager 1110 may receive a second set of encoded symbols based on transmitting the indication of the source symbol, the second set of encoded symbols encoded according to the one or more raptor codes and associated with one or more source symbols of the set of source symbols. The communication manager 1110 may successfully recover from the first set of encoded symbols a source symbol of a set of source symbols associated with the first set of encoded symbols.

The transceiver 1115 may communicate bi-directionally, via one or more antennas, wired, or wireless links as described herein. For example, the transceiver 1115 may represent a wireless transceiver and may communicate bi-directionally with another wireless transceiver. The transceiver 1115 may also include a modem to modulate the packets and provide the modulated packets to the antennas for transmission, and to demodulate packets received from the antennas.

In some cases, the wireless device may include a single antenna 1125. However, in some cases the device may have more than one antenna 1125, which may be capable of concurrently transmitting or receiving multiple wireless transmissions.

The memory 1130 may include RAM and ROM. The memory 1130 may store computer-readable, computer-executable code 1130 including instructions that, when executed, cause the processor to perform various functions described herein. In some cases, the memory 1130 may contain, among other things, a BIOS which may control basic hardware or software operation such as the interaction with peripheral components or devices.

The code 1135 may include instructions to implement aspects of the present disclosure, including instructions to support wireless communications. The code 1135 may be stored in a non-transitory computer-readable medium such as system memory or other type of memory. In some cases, the code 1135 may not be directly executable by the processor 1140 but may cause a computer (e.g., when compiled and executed) to perform functions described herein.

The processor 1140 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1140 may be configured to operate a memory array using a memory controller. In other cases, a memory controller may be integrated into the processor 1140. The processor 1140 may be configured to execute computer-readable instructions stored in a memory (e.g., the memory 1130) to cause the device 1105 to perform various functions (e.g., functions or tasks supporting raptor code feedback).

Figure 12:
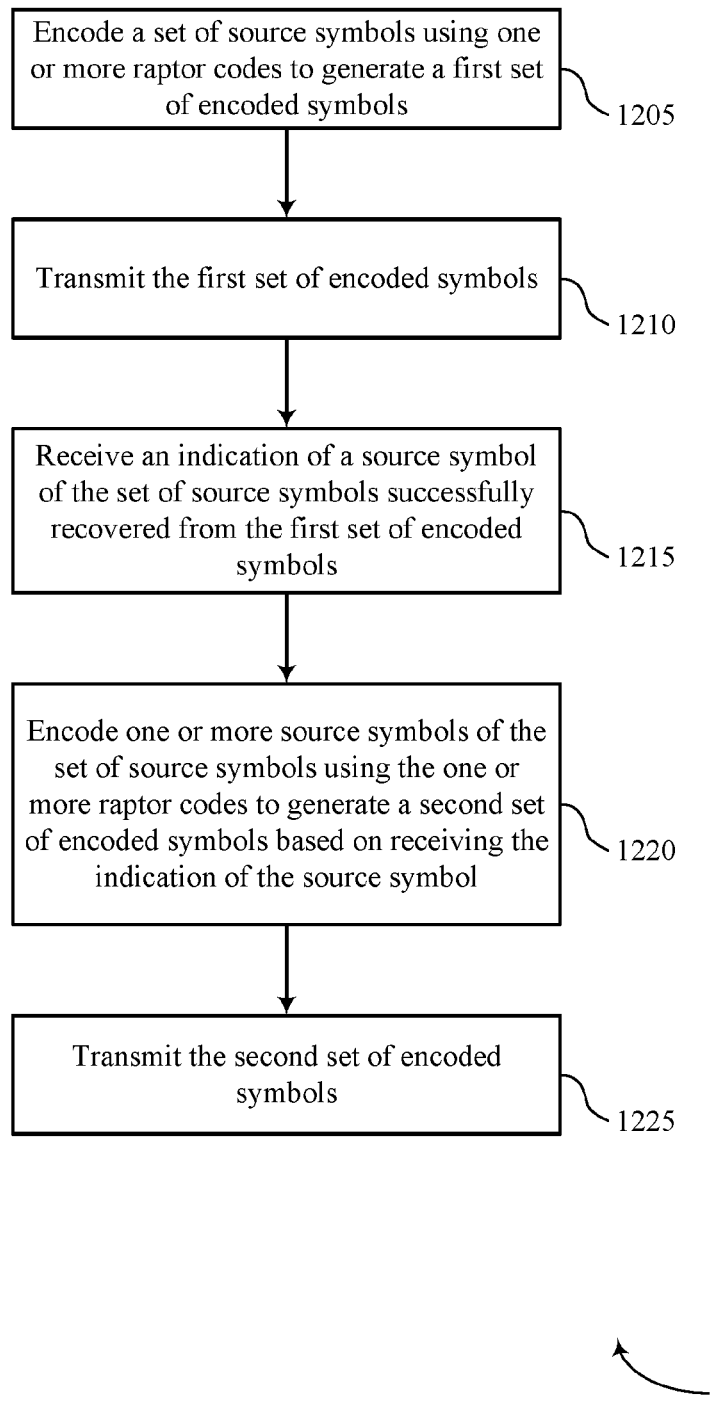
FIGS. 12 through 15 show flowcharts illustrating methods that support raptor code feedback in accordance with aspects of the present disclosure.

FIG. 12 shows a flowchart illustrating a method 1200 that supports raptor code feedback in accordance with aspects of the present disclosure. The operations of method 1200 may be implemented by a UE 115 or base station 105 or its components as described herein. For example, the operations of method 1200 may be performed by a communication manager as described with reference to FIGS. 7 through 11. In some examples, a UE or base station may execute a set of instructions to control the functional elements of the UE or base station to perform the described functions. Additionally or alternatively, a UE or base station may perform aspects of the described functions using special-purpose hardware.

At 1205, the UE or base station may encode a set of source symbols using one or more raptor codes to generate a first set of encoded symbols. The operations of 1205 may be performed according to the methods described herein. In some examples, aspects of the operations of 1205 may be performed by a symbol encoding component as described with reference to FIGS. 7 through 11.

At 1210, the UE or base station may transmit the first set of encoded symbols. The operations of 1210 may be performed according to the methods described herein. In some examples, aspects of the operations of 1210 may be performed by a symbol transmitter as described with reference to FIGS. 7 through 11.

At 1215, the UE or base station may receive an indication of a source symbol of the set of source symbols successfully recovered from the first set of encoded symbols. The operations of 1215 may be performed according to the methods described herein. In some examples, aspects of the operations of 1215 may be performed by a feedback component as described with reference to FIGS. 7 through 11.

At 1220, the UE or base station may encode one or more source symbols of the set of source symbols using the one or more raptor codes to generate a second set of encoded symbols based on receiving the indication of the source symbol. The operations of 1220 may be performed according to the methods described herein. In some examples, aspects of the operations of 1220 may be performed by a symbol encoding component as described with reference to FIGS. 7 through 11.

At 1225, the UE or base station may transmit the second set of encoded symbols. The operations of 1225 may be performed according to the methods described herein. In some examples, aspects of the operations of 1225 may be performed by a symbol transmitter as described with reference to FIGS. 7 through 11.

Figure 13:
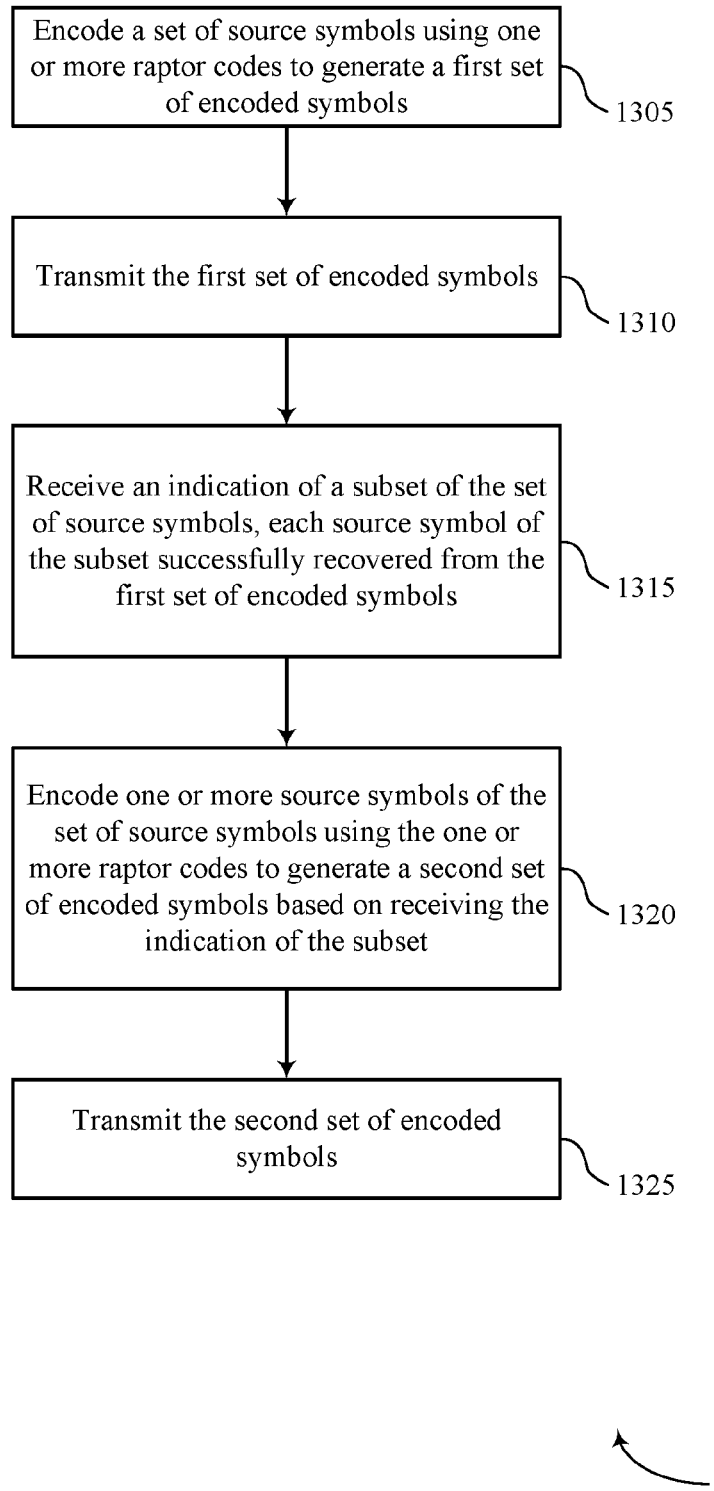

FIG. 13 shows a flowchart illustrating a method 1300 that supports raptor code feedback in accordance with aspects of the present disclosure. The operations of method 1300 may be implemented by a UE 115 or base station 105 or its components as described herein. For example, the operations of method 1300 may be performed by a communication manager as described with reference to FIGS. 7 through 11. In some examples, a UE or base station may execute a set of instructions to control the functional elements of the UE or base station to perform the described functions. Additionally or alternatively, a UE or base station may perform aspects of the described functions using special-purpose hardware.

At 1305, the UE or base station may encode a set of source symbols using one or more raptor codes to generate a first set of encoded symbols. The operations of 1305 may be performed according to the methods described herein. In some examples, aspects of the operations of 1305 may be performed by a symbol encoding component as described with reference to FIGS. 7 through 11.

At 1310, the UE or base station may transmit the first set of encoded symbols. The operations of 1310 may be performed according to the methods described herein. In some examples, aspects of the operations of 1310 may be performed by a symbol transmitter as described with reference to FIGS. 7 through 11.

At 1315, the UE or base station may receive an indication of a subset of the set of source symbols, each source symbol of the subset successfully recovered from the first set of encoded symbols. The operations of 1315 may be performed according to the methods described herein. In some examples, aspects of the operations of 1315 may be performed by a feedback component as described with reference to FIGS. 7 through 11.

At 1320, the UE or base station may encode one or more source symbols of the set of source symbols using the one or more raptor codes to generate a second set of encoded symbols based on receiving the indication of the subset. The operations of 1320 may be performed according to the methods described herein. In some examples, aspects of the operations of 1320 may be performed by a symbol encoding component as described with reference to FIGS. 7 through 11.

At 1325, the UE or base station may transmit the second set of encoded symbols. The operations of 1325 may be performed according to the methods described herein. In some examples, aspects of the operations of 1325 may be performed by a symbol transmitter as described with reference to FIGS. 7 through 11.

Figure 14:
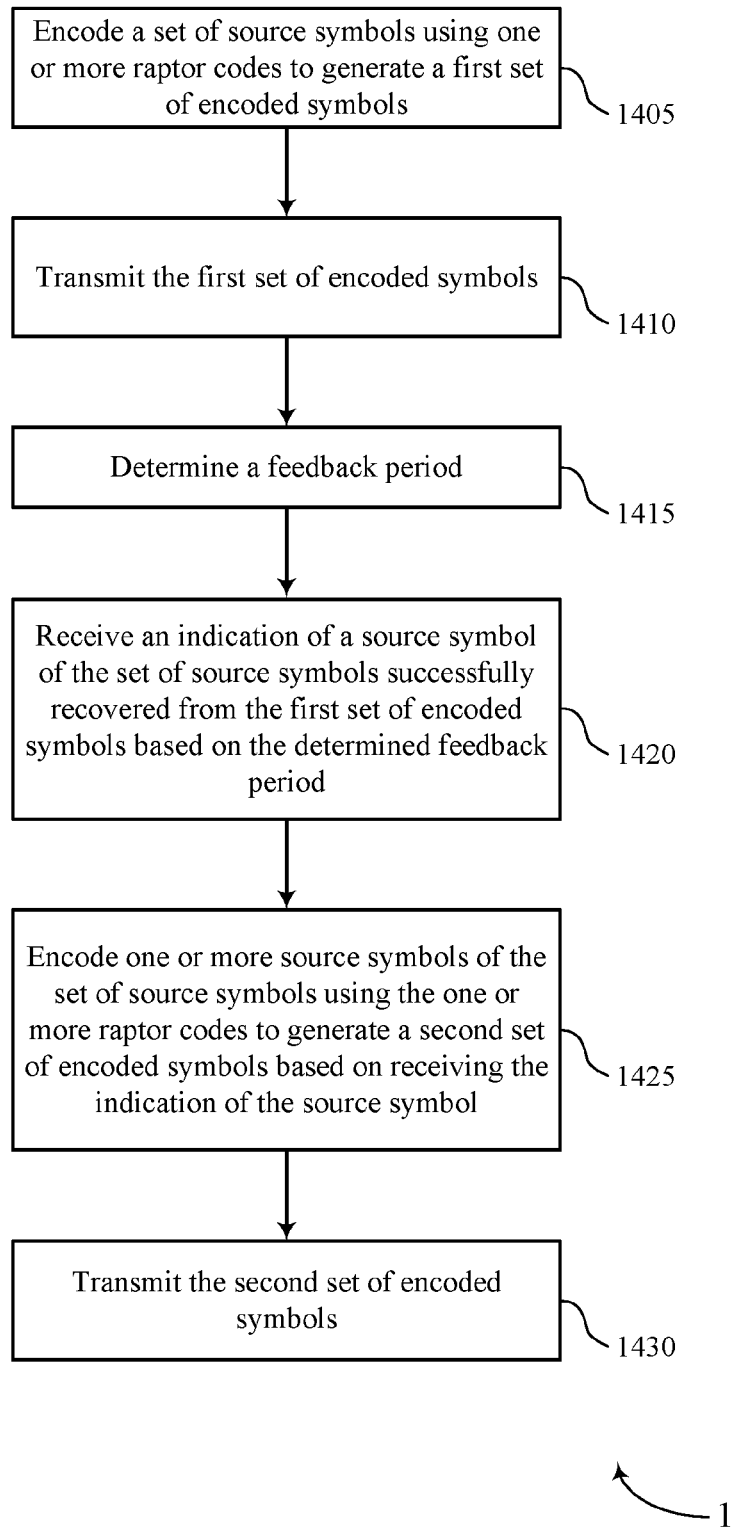

FIG. 14 shows a flowchart illustrating a method 1400 that supports raptor code feedback in accordance with aspects of the present disclosure. The operations of method 1400 may be implemented by a UE 115 or base station 105 or its components as described herein. For example, the operations of method 1400 may be performed by a communication manager as described with reference to FIGS. 7 through 11. In some examples, a UE or base station may execute a set of instructions to control the functional elements of the UE or base station to perform the described functions. Additionally or alternatively, a UE or base station may perform aspects of the described functions using special-purpose hardware.

At 1405, the UE or base station may encode a set of source symbols using one or more raptor codes to generate a first set of encoded symbols. The operations of 1405 may be performed according to the methods described herein. In some examples, aspects of the operations of 1405 may be performed by a symbol encoding component as described with reference to FIGS. 7 through 11.

At 1410, the UE or base station may transmit the first set of encoded symbols. The operations of 1410 may be performed according to the methods described herein. In some examples, aspects of the operations of 1410 may be performed by a symbol transmitter as described with reference to FIGS. 7 through 11.

At 1415, the UE or base station may determine a feedback period. The operations of 1415 may be performed according to the methods described herein. In some examples, aspects of the operations of 1415 may be performed by a feedback period determination component as described with reference to FIGS. 7 through 11.

At 1420, the UE or base station may receive an indication of a source symbol of the set of source symbols successfully recovered from the first set of encoded symbols based on the determined feedback period. The operations of 1420 may be performed according to the methods described herein. In some examples, aspects of the operations of 1420 may be performed by a feedback component as described with reference to FIGS. 7 through 11.

At 1425, the UE or base station may encode one or more source symbols of the set of source symbols using the one or more raptor codes to generate a second set of encoded symbols based on receiving the indication of the source symbol. The operations of 1425 may be performed according to the methods described herein. In some examples, aspects of the operations of 1425 may be performed by a symbol encoding component as described with reference to FIGS. 7 through 11.

At 1430, the UE or base station may transmit the second set of encoded symbols. The operations of 1430 may be performed according to the methods described herein. In some examples, aspects of the operations of 1430 may be performed by a symbol transmitter as described with reference to FIGS. 7 through 11.

Figure 15:
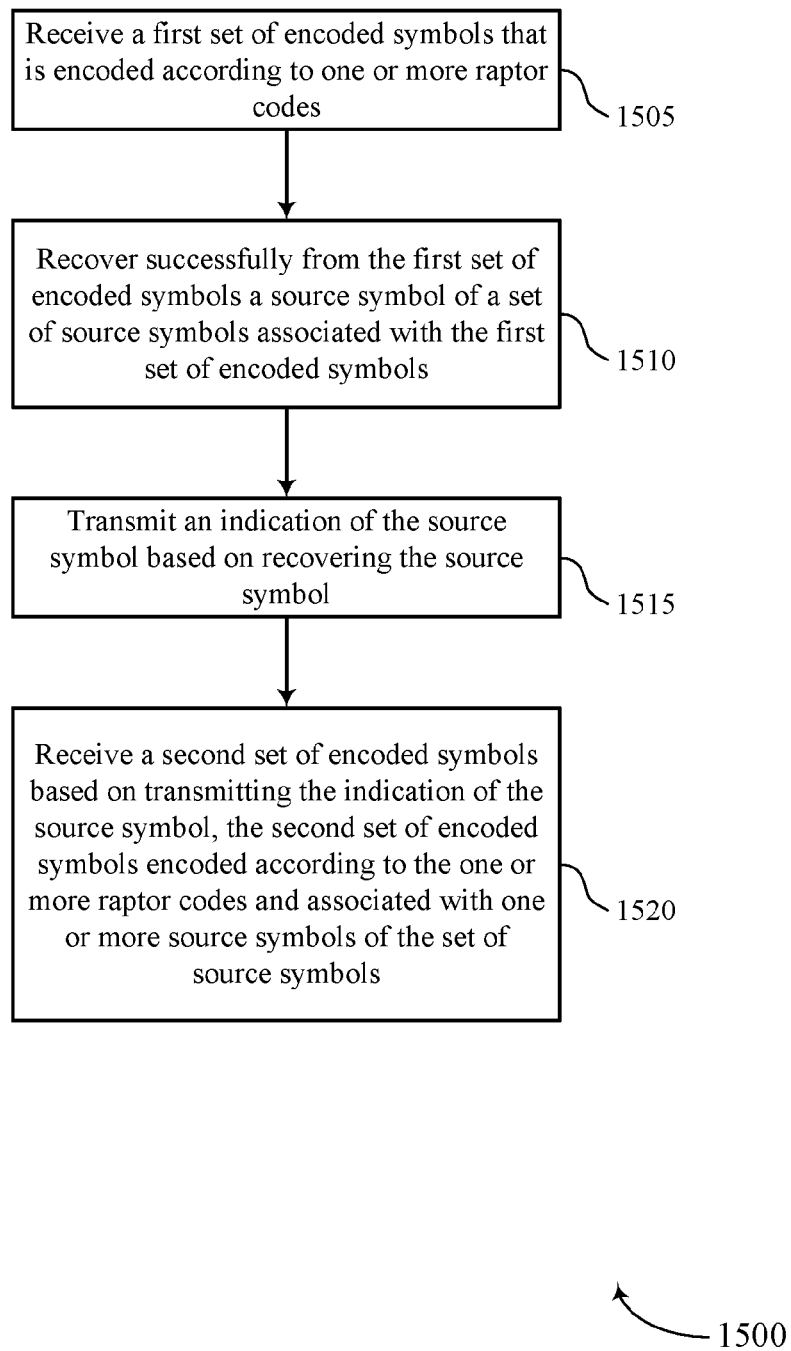

FIG. 15 shows a flowchart illustrating a method 1500 that supports raptor code feedback in accordance with aspects of the present disclosure. The operations of method 1500 may be implemented by a UE 115 or base station 105 or its components as described herein. For example, the operations of method 1500 may be performed by a communication manager as described with reference to FIGS. 7 through 11. In some examples, a UE or base station may execute a set of instructions to control the functional elements of the UE or base station to perform the described functions. Additionally or alternatively, a UE or base station may perform aspects of the described functions using special-purpose hardware.

At 1505, the UE or base station may receive a first set of encoded symbols that is encoded according to one or more raptor codes. The operations of 1505 may be performed according to the methods described herein. In some examples, aspects of the operations of 1505 may be performed by a symbol receiver as described with reference to FIGS. 7 through 11.

At 1510, the UE or base station may recover successfully from the first set of encoded symbols a source symbol of a set of source symbols associated with the first set of encoded symbols. The operations of 1510 may be performed according to the methods described herein. In some examples, aspects of the operations of 1510 may be performed by a symbol decoding component as described with reference to FIGS. 7 through 11.

At 1515, the UE or base station may transmit an indication of the source symbol based on recovering the source symbol. The operations of 1515 may be performed according to the methods described herein. In some examples, aspects of the operations of 1515 may be performed by a feedback component as described with reference to FIGS. 7 through 11.

At 1520, the UE or base station may receive a second set of encoded symbols based on transmitting the indication of the source symbol, the second set of encoded symbols encoded according to the one or more raptor codes and associated with one or more source symbols of the set of source symbols. The operations of 1520 may be performed according to the methods described herein. In some examples, aspects of the operations of 1520 may be performed by a symbol receiver as described with reference to FIGS. 7 through 11.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    encoding a set of source symbols using one or more raptor codes to generate a first set of encoded symbols;
    transmitting the first set of encoded symbols;
    receiving, during a feedback period, a periodic indication of a source symbol of the set of source symbols successfully recovered from the first set of encoded symbols;
    encoding one or more source symbols of the set of source symbols unsuccessfully recovered from the first set of encoded symbols using the one or more raptor codes to generate a second set of encoded symbols based at least in part on receiving the periodic indication of the source symbol successfully recovered from the first set of encoded symbols; and
    transmitting the second set of encoded symbols.

2. The method of claim 1, wherein receiving the periodic indication of the source symbol comprises:
    receiving an indication of a subset of the set of source symbols that comprises the source symbol, each source symbol of the subset successfully recovered from the first set of encoded symbols.

3. The method of claim 1, further comprising:
    receiving an indication of a second subset of the set of source symbols after transmitting the first set of encoded symbols and after receiving the periodic indication of the source symbol successfully recovered from the first set of encoded symbols, wherein the second subset of the set of source symbols comprises each source symbol unsuccessfully recovered from the first set of encoded symbols.

4. The method of claim 1, further comprising:
    determining the feedback period after transmitting the first set of encoded symbols, wherein receiving the periodic indication of the source symbol is based at least in part on the determined feedback period.

5. The method of claim 4, wherein determining the feedback period is based at least in part on a number of symbols in the first set of encoded symbols.

6. The method of claim 4, further comprising:
    receiving an indication of a number of symbols in the first set of encoded symbols successfully received; and
    determining the feedback period based at least in part on receiving the indication of the number of symbols.

7. The method of claim 4, wherein determining the feedback period is based at least in part on a number of symbols in a third set of encoded symbols, wherein the third set of encoded symbols was transmitted before transmitting the first set of encoded symbols.

8. The method of claim 4, further comprising:
    receiving an indication of a number of symbols in a third set of encoded symbols successfully received, wherein the third set of encoded symbols was transmitted before transmitting the first set of encoded symbols, and wherein determining the feedback period is based at least in part on receiving the indication of the number of symbols.

9. A method for wireless communication, comprising:
    receiving a first set of encoded symbols that is encoded according to one or more raptor codes;
    recovering successfully from the first set of encoded symbols a source symbol of a set of source symbols associated with the first set of encoded symbols;
    transmitting, during a feedback period, a periodic indication of the source symbol successfully recovered from the first set of encoded symbols based at least in part on recovering the source symbol; and
    receiving a second set of encoded symbols based at least in part on transmitting the periodic indication of the source symbol successfully recovered from the first set of encoded symbols, the second set of encoded symbols encoded according to the one or more raptor codes and associated with one or more source symbols of the set of source symbols unsuccessfully recovered from the first set of encoded symbols.

10. The method of claim 9, further comprising:
    recovering successfully other source symbols of a subset of the set of source symbols after recovering successfully the source symbol, wherein the subset of the set of source symbols includes each source symbol successfully recovered from the first set of encoded symbols, and wherein transmitting the periodic indication of the source symbol successfully recovered from the first set of encoded symbols comprises transmitting an indication of the subset.

11. The method of claim 10, wherein the one or more source symbols excludes each source symbol of the subset based at least in part on transmitting the indication of the subset.

12. The method of claim 11, further comprising:
    transmitting an indication of a second subset of the set of source symbols after receiving the first set of encoded symbols, wherein the second subset of the set of source symbols comprises each source symbol unsuccessfully recovered from the first set of encoded symbols.

13. The method of claim 9, further comprising:
    transmitting an indication of a number of symbols in the first set of encoded symbols, wherein a time for transmitting the periodic indication of the source symbol is based at least in part on transmitting the indication of the number of symbols.

14. The method of claim 9, further comprising:
    transmitting an indication of a number of symbols in a third set of encoded symbols, wherein the third set of encoded symbols was received before the first set of encoded symbols, and wherein a time for transmitting the periodic indication of the source symbol is based at least in part on transmitting the indication of the number of symbols.

15. The method of claim 9, wherein the source symbol has an associated degree whose value is one, and wherein transmitting the periodic indication of the source symbol comprises:
transmitting an indication for each source symbol successfully recovered and that has an associated degree whose value is one; and
refraining from transmitting an indication for each source symbol successfully recovered and that has an associated degree whose value is greater than one.

16. A memory system for wireless communication, comprising:
one or more processors,
one or more memories in electronic communication with the one or more processors, and
instructions stored in the one or more memories and executable by the one or more processors to cause the memory system to:
encode a set of source symbols using one or more raptor codes to generate a first set of encoded symbols;
transmit the first set of encoded symbols;
receive, during a feedback period, a periodic indication of a source symbol of the set of source symbols successfully recovered from the first set of encoded symbols;
encode one or more source symbols of the set of source symbols unsuccessfully recovered from the first set of encoded symbols using the one or more raptor codes to generate a second set of encoded symbols based at least in part on receiving the periodic indication of the source symbol successfully recovered from the first set of encoded symbols; and
transmit the second set of encoded symbols.

17. The memory system of claim 16, wherein the instructions are executable by the one or more processors to cause the memory system to:
receive an indication of a subset of the set of source symbols that comprises the source symbol, each source symbol of the subset successfully recovered from the first set of encoded symbols.

18. The memory system of claim 16, wherein the instructions are further executable by the one or more processors to cause the memory system to:
receive an indication of a second subset of the set of source symbols after transmitting the first set of encoded symbols and receiving the periodic indication of the source symbol successfully recovered from the first set of encoded symbols, wherein the second subset of the set of source symbols comprises each source symbol unsuccessfully recovered from the first set of encoded symbols.

19. The memory system of claim 16, wherein the instructions are further executable by the one or more processors to cause the memory system to:
determine the feedback period after transmitting the first set of encoded symbols, wherein receiving the periodic indication of the source symbol is based at least in part on the determined feedback period.

20. The memory system of claim 19, wherein determining the feedback period is based at least in part on a number of symbols in the first set of encoded symbols.

21. The memory system of claim 19, wherein the instructions are further executable by the one or more processors to cause the memory system to:
receive an indication of a number of symbols in the first set of encoded symbols successfully received; and
determine the feedback period based at least in part on receiving the indication of the number of symbols.

22. The memory system of claim 19, wherein determining the feedback period is based at least in part on a number of symbols in a third set of encoded symbols, wherein the third set of encoded symbols was transmitted before transmitting the first set of encoded symbols.

23. The memory system of claim 19, wherein the instructions are further executable by the one or more processors to cause the memory system to:
receive an indication of a number of symbols in a third set of encoded symbols successfully received, wherein the third set of encoded symbols was transmitted before transmitting the first set of encoded symbols, and wherein determining the feedback period is based at least in part on receiving the indication of the number of symbols.

24. An apparatus for wireless communication, comprising:
one or more processors,
one or more memories in electronic communication with the one or more processors, and
instructions stored in the one or more memories and executable by the one or more processors to cause the apparatus to:
receive a first set of encoded symbols that is encoded according to one or more raptor codes;
recover successfully from the first set of encoded symbols a source symbol of a set of source symbols associated with the first set of encoded symbols;
transmit, during a feedback period, a periodic indication of the source symbol successfully recovered from the first set of encoded symbols based at least in part on recovering the source symbol; and
receive a second set of encoded symbols based at least in part on transmitting the periodic indication of the source symbol successfully recovered from the first set of encoded symbols, the second set of encoded symbols encoded according to the one or more raptor codes and associated with one or more source symbols of the set of source symbols unsuccessfully recovered from the first set of encoded symbols.

25. The apparatus of claim 24, wherein the instructions are further executable by the one or more processors to cause the apparatus to:
recover successfully other source symbols of a subset of the set of source symbols after recovering successfully the source symbol, wherein the subset of the set of source symbols comprises each source symbol successfully recovered from the first set of encoded symbols, and wherein transmitting the periodic indication of the source symbol successfully recovered from the first set of encoded symbols is based at least in part on recovering successfully each source symbol of the subset.

26. The apparatus of claim 25, wherein the one or more source symbols excludes each source symbol of the subset based at least in part on transmitting an indication of the subset.

27. The apparatus of claim 26, wherein the instructions are further executable by the one or more processors to cause the apparatus:

transmit an indication of a second subset of the set of source symbols after receiving the first set of encoded symbols, wherein the second subset of the set of source symbols comprises each source symbol unsuccessfully recovered from the first set of encoded symbols.

28. The apparatus of claim 24, wherein the instructions are further executable by the one or more processors to cause the apparatus to:

transmit an indication of a number of symbols in the first set of encoded symbols, wherein a time for transmitting the periodic indication of the source symbol is based at least in part on transmitting the indication of the number of symbols.

29. The apparatus of claim 24, wherein the instructions are further executable by the one or more processors to cause the apparatus to:

transmit an indication of a number of symbols in a third set of encoded symbols, wherein the third set of encoded symbols was received before the first set of encoded symbols, and wherein a time for transmitting the periodic indication of the source symbol is based at least in part on transmitting the indication of the number of symbols.

30. The apparatus of claim 24, wherein the source symbol has an associated degree whose value is one, and wherein the instructions are executable by the one or more processors to cause the apparatus to:

transmit an indication for each source symbol successfully recovered and that has an associated degree whose value is one; and refrain from transmitting an indication for each source symbol successfully recovered and that has an associated degree whose value is greater than one.

* * * * *